(12) United States Patent
Kwon et al.

(10) Patent No.: US 10,349,535 B2
(45) Date of Patent: Jul. 9, 2019

(54) DISPLAY DEVICE

(71) Applicant: Samsung Display Co., Ltd., Yongin-si, Gyeonggi-Do (KR)

(72) Inventors: Yoonsoo Kwon, Hwaseong-si (KR); Ilkoo Nah, Yongin-si (KR); Hanjin Ryu, Seoul (KR); Donggun Park, Seoul (KR); Jinho Ha, Asan-si (KR); Gabsoo Han, Seoul (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 15/188,383

(22) Filed: Jun. 21, 2016

(65) Prior Publication Data
US 2017/0118850 A1 Apr. 27, 2017

(30) Foreign Application Priority Data
Oct. 23, 2015 (KR) .................. 10-2015-0148283

(51) Int. Cl.
*G06F 1/16* (2006.01)
*H05K 5/00* (2006.01)
*H05K 5/02* (2006.01)
*G02F 1/1333* (2006.01)
*F16M 11/20* (2006.01)
*G02F 1/1345* (2006.01)
*H04N 5/64* (2006.01)
*G09G 3/00* (2006.01)

(52) U.S. Cl.
CPC ..... *H05K 5/0017* (2013.01); *G02F 1/133308* (2013.01); *G06F 1/1601* (2013.01); *H05K 5/0234* (2013.01); *F16M 11/20* (2013.01); *G02F 1/13452* (2013.01); *G02F 2001/133388* (2013.01); *G06F 2200/1612* (2013.01); *G09G 3/00* (2013.01); *G09G 2370/16* (2013.01); *G09G 2380/02* (2013.01); *H04N 5/64* (2013.01)

(58) Field of Classification Search
CPC .. H05K 5/0017; H05K 5/0234; G06F 1/1601; G06F 1/1652; G06F 1/1626; G06F 1/1632
See application file for complete search history.

(56) References Cited

U.S. PATENT DOCUMENTS 1,681,586 A * 8/1928 Kessler .................. G09F 1/14
248/309.1
5,857,654 A 1/1999 Berman
(Continued)

FOREIGN PATENT DOCUMENTS

EP 2664957 A1 11/2013
EP 2759903 A2 7/2014
(Continued)

*Primary Examiner* — Abhishek M Rathod
(74) *Attorney, Agent, or Firm* — Cantor Colburn LLP

(57) ABSTRACT

A display device includes a curved display module which includes a signal receiver receiving an image signal from an outside source, an image display part displaying an image corresponding to the image signal and being curved, and a frame surrounding at least a portion of an edge of the image display part and a stand which includes a signal transmitter transmitting the image signal and a coupling part in which a curved groove is defined where a portion of the curved display module is accommodated in the groove.

19 Claims, 23 Drawing Sheets

(56) References Cited

U.S. PATENT DOCUMENTS

| | | | | |
|---|---|---|---|---|
| 6,762,929 B2* | 7/2004 | Sawyer | | G06F 1/1601 |
| | | | | 248/535 |
| D741,835 S * | 10/2015 | Gundlach | | D14/204 |
| 2004/0052037 A1* | 3/2004 | Sawyer | | G06F 1/1601 |
| | | | | 361/679.05 |
| 2004/0061683 A1* | 4/2004 | Mochizuki | | G06F 1/1601 |
| | | | | 345/168 |
| 2011/0084183 A1* | 4/2011 | Kim | | G09F 1/14 |
| | | | | 248/176.1 |
| 2011/0188189 A1* | 8/2011 | Park | | G05B 11/01 |
| | | | | 361/679.05 |
| 2013/0170126 A1* | 7/2013 | Lee | | G06F 1/1654 |
| | | | | 361/679.17 |
| 2013/0242483 A1* | 9/2013 | Hirasawa | | G02F 1/133308 |
| | | | | 361/679.01 |
| 2013/0335929 A1* | 12/2013 | Cavallaro | | G06F 1/1652 |
| | | | | 361/749 |
| 2014/0009914 A1* | 1/2014 | Cho | | G09F 9/35 |
| | | | | 362/97.3 |
| 2015/0286253 A1* | 10/2015 | Jung | | G06F 1/1652 |
| | | | | 361/679.3 |

FOREIGN PATENT DOCUMENTS

| | | |
|---|---|---|
| JP | 2007333818 A | 12/2007 |
| JP | 2013190576 A | 9/2013 |
| KR | 1020130073331 A | 7/2013 |
| KR | 1020140064182 A | 5/2014 |
| KR | 1020150018339 A | 2/2015 |
| KR | 1020150037300 A | 4/2015 |
| KR | 1020150080837 A | 7/2015 |
| KR | 1020150092428 A | 8/2015 |
| WO | 0005700 A1 | 2/2000 |

* cited by examiner

DISPLAY DEVICE

This application claims priority to Korean Patent Application No. 10-2015-0148283, filed on Oct. 23, 2015, and all the benefits accruing therefrom under 35 U.S.C. § 119, the content of which in its entirety is herein incorporated by reference.

BACKGROUND

1. Field

Exemplary embodiments of the invention relate to a display device. More particularly, exemplary embodiments of the invention relate to a display device including a display module and a stand.

2. Description of the Related Art

A display device which displays an image is applied to a variety of information processing devices, such as a television set, a monitor, a notebook computer, a mobile phone, etc. In recent years, a curved display device having a curved shape has been developed in addition to a display device including a flat panel display module. The curved display device including a curved display module provides a user with an image having an improved three-dimensional effect, increased immersiveness, and a presence of the image through a curved display area.

SUMMARY

Exemplary embodiments of the invention provide a display device having a substantially slim shape.

Exemplary embodiments of the invention provide a display device capable of individually managing a display module and a stand.

Exemplary embodiments of the invention provide a display device including a curved display module and a stand. The curved display module includes a signal receiver receiving an image signal from an outside source, an image display part displaying an image corresponding to the image signal and being curved, and a frame surrounding at least a portion of an edge of the image display part. The stand includes a signal transmitter transmitting the image signal and a coupling part in which a curved groove is defined. A portion of the curved display module is accommodated in the groove.

In an exemplary embodiment, at least a portion of the frame may be accommodated in the groove.

In an exemplary embodiment, the curved display module may include an exit surface which displays the image through at least a portion thereof, an exit rear surface facing the exit surface, a lower surface connected to the exit surface and the exit rear surface, an upper surface facing the lower surface, a first side surface connected to the upper surface and the lower surface, and a second side surface facing the first side surface. At least a portion of the lower surface may be accommodated in the groove.

In an exemplary embodiment, the signal receiver may be disposed on the lower surface.

In an exemplary embodiment, the exit surface may include a display area which displays the image and a non-display area which does not display the image. At least a portion of the non-display area may be accommodated in the groove.

In an exemplary embodiment, the non-display area may include a first sub-non-display area of which at least a portion thereof is accommodated in the groove and a second sub-non-display area spaced apart from the first sub-non-display area. A length in a vertical direction of the first sub-non-display area may be greater than a length in the vertical direction of the second sub-non-display area.

In an exemplary embodiment, the coupling part may include a bottom portion, a first sidewall portion connected to the bottom portion, and a second sidewall portion contacting the bottom portion and spaced apart from the first sidewall portion. The groove may be defined by an upper surface of the bottom portion, an inner surface of the first sidewall portion, and an inner surface of the second sidewall portion.

In an exemplary embodiment, the signal transmitter may be disposed on the upper surface of the bottom portion.

In an exemplary embodiment, each of the first sidewall portion and the second sidewall portion may be curved.

In an exemplary embodiment, a distance between the first sidewall portion and the second sidewall portion may be constant.

In an exemplary embodiment, each of the inner surface of the first sidewall portion and the inner surface of the second sidewall portion may be curved.

In an exemplary embodiment, the coupling part further may include a first connection portion connecting the first sidewall portion and the second sidewall portion and a second connection portion connecting the first sidewall portion and the second sidewall portion and facing the first connection portion. The groove may be defined by the upper surface of the bottom portion, the inner surface of the first sidewall portion, the inner surface of the second sidewall portion, an inner surface of the first connection portion, and an inner surface of the second connection portion.

In an exemplary embodiment, the groove may have a curvature radius that is variable corresponding to a curvature radius of the curved display module.

In an exemplary embodiment, a length in a horizontal direction of the stand may be equal to or greater than about 2/3 and equal to or smaller than about 5/3 of a length in the horizontal direction of the curved display module.

Exemplary embodiments of the invention provide a display device including a curved display module and a stand. The curved display module receives an image signal from an outside source, displays an image corresponding to the image signal, and is curved. A curved groove is defined in the stand which transmits the image signal. A portion of the curved display module is accommodated in the groove.

In an exemplary embodiment, the curved display module may include an image display part which displays the image, a frame surrounding at least a portion of an edge of the image display part, and a signal receiver which receives the image signal. The stand may include a coupling part in which the groove is defined and which includes a signal transmitter which transmits the image signal.

In an exemplary embodiment, the signal receiver may be disposed on a lower surface of the frame.

In an exemplary embodiment, the coupling part may include a bottom portion, a first sidewall portion connected to the bottom portion, and a second sidewall portion contacting the bottom portion and spaced apart from the first sidewall portion. The groove may be defined by an upper surface of the bottom portion, an inner surface of the first sidewall portion, and an inner surface of the second sidewall portion.

In an exemplary embodiment, the signal transmitter may be disposed on the upper surface of the bottom portion.

Exemplary embodiments of the invention provide a display device including a curved display module and a stand. The curved display module includes a signal receiver which receives an image signal from an outside source, an image display part which displays an image corresponding to the image signal and is curved, and a frame surrounding at least a portion of an edge of the image display part. The stand includes a signal transmitter which transmits the image signal and a coupling part in which a curved groove is defined.

In an exemplary embodiment, the coupling part may include a bottom portion, a first sidewall portion connected to the bottom portion, and a second sidewall portion contacting the bottom portion and spaced apart from the first sidewall portion. The groove may be defined by an upper surface of the bottom portion, an inner surface of the first sidewall portion, and an inner surface of the second sidewall portion. A portion of the curved display module may be accommodated in the groove. The signal receiver may be disposed on a lower surface of the frame. The signal transmitter may be disposed on the upper surface of the bottom portion.

According to the above, the display device may be substantially slim. In addition, the display module and the stand may be individually managed.

BRIEF DESCRIPTION OF THE DRAWINGS

The above and other advantages of the invention will become readily apparent by reference to the following detailed description when considered in conjunction with the accompanying drawings, in which.

DETAILED DESCRIPTION

Figure 1A:
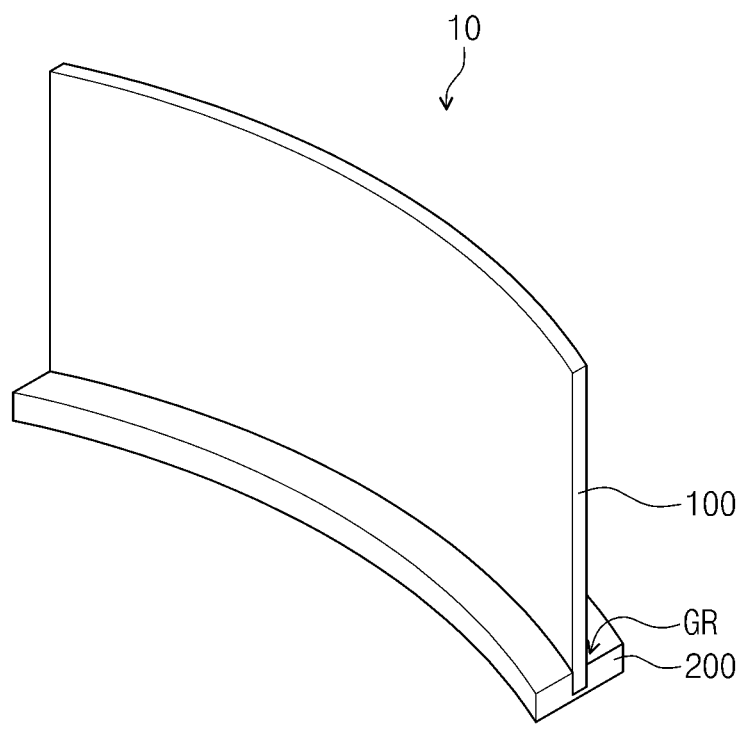
FIG. 1A is a perspective view showing an exemplary embodiment of a display device according to the invention.

The following description with reference to the accompanying drawings is provided to assist in a comprehensive understanding of various embodiments of the invention as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the invention.

The use of the terms first, second, etc. do not denote any order or importance, but rather the terms first, second, etc. are used to distinguish one element from another. Like numerals refer to like elements throughout. It will be understood that when an element such as a layer, film, region, or substrate is referred to as being "on" another element, it can be directly on the other element or intervening elements may also be present. It is to be understood that the singular forms "a," "an," and "the" include plural referents unless the context clearly dictates otherwise.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, the invention will be explained in detail with reference to the accompanying drawings.

Figure 1B:
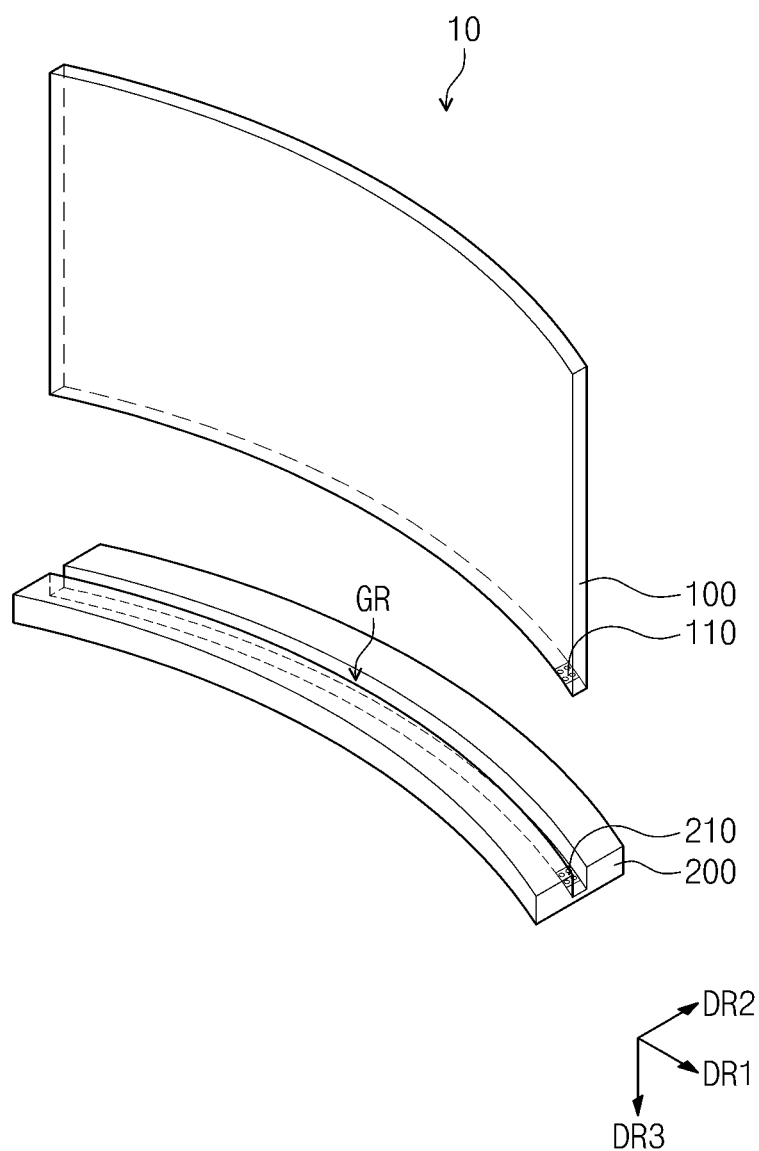
FIG. 1B is an exploded perspective view showing an exemplary embodiment of a display device according to the invention.

FIG. 1A is a perspective view showing a display device 10 according to an exemplary embodiment of the invention and FIG. 1B is an exploded perspective view showing the display device 10 according to an exemplary embodiment of the invention.

Referring to FIGS. 1A and 1B, the display device 10 includes a curved display module 100 and a stand 200. The curved display module 100 receives an image signal ES (refer to FIG. 2) and displays an image. The curved display module 100 is attachable to and detachable from the stand 200. The curved display module 100 includes a signal receiver 110 to receive the image signal ES (refer to FIG. 2). The signal receiver 110 receives various electrical signals including a power source signal from a signal transmitter 210 in addition to the image signal ES (refer to FIG. 2). The curved display module 100 does not display the image in the case where the image signal ES (refer to FIG. 2) is not provided from the stand 200.

The curved display module 100 is partially accommodated in a groove GR and stood to allow an exit surface 101 (refer to FIG. 3) to face a user. The curved display module 100 may be bent. The curved display module 100 may be curved. The curved display module 100 is concaved when viewed in an exit rear surface direction DR2 from the exit surface 101 (refer to FIG. 3) to an exit rear surface 102 (refer to FIG. 3), i.e., when viewed from the point O (refer to FIG. 3), but it should not be limited thereto or thereby. That is, the curved display module 100 may be convex when viewed in the exit rear surface direction DR2. The curved display module 100 may be rigid or flexible. The term "flexible" used herein means that the curved display module 100 is bendable, and thus the curved display module 100 may be completely folded or partially bent.

In the illustrated exemplary embodiment, the display device 10 includes the curved display module 100, but the display device 10 may include a flat display module according to other exemplary embodiments.

Figure 2:
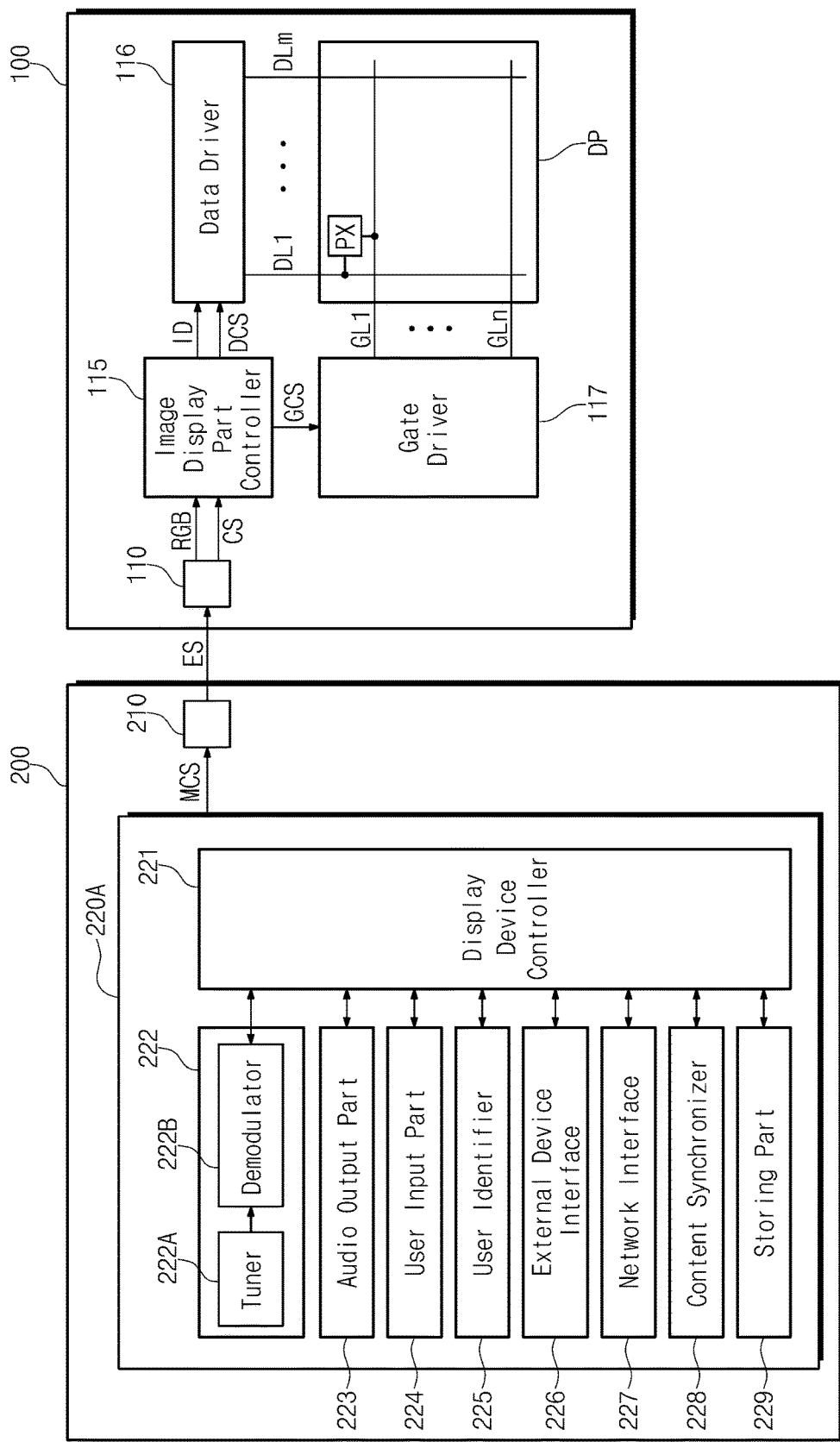
FIG. 2 is a block diagram showing an exemplary embodiment of a display device according to the invention.

The groove GR in which a portion of the curved display module 100 is accommodated is defined in the stand 200 which provides the curved display module 100 with the image signal ES (refer to FIG. 2). The stand 200 may fix the curved display module 100 thereto. The signal transmitter 210 is disposed in the groove GR to generate the image signal ES (refer to FIG. 2). The signal transmitter 210 applies the various electrical signals including the power source signal in addition to the image signal ES (refer to FIG. 2).

The groove GR may have a bent or curved shape. The portion of the curved display module 100 is accommodated in the groove GR.

In FIGS. 1A and 1B, the image signal ES (refer to FIG. 2) is applied to the signal receiver 110 of the curved display module 100 from the signal transmitter 210 of the stand 200 when the signal transmitter 210 contacts the signal receiver 110, but it should not be limited thereto or thereby. In another exemplary embodiment, the image signal ES (refer to FIG. 2) may be applied to the signal receiver 110 of the curved display module 100 from the signal transmitter 210 of the stand 200 in wireless communication system. Accordingly, the image signal ES (refer to FIG. 2) may be applied to the signal receiver 110 of the curved display module 100 from the signal transmitter 210 of the stand 200 even when the signal transmitter 210 does not contact the signal receiver 110.

FIG. 2 is a block diagram showing a display device according to an exemplary embodiment of the invention.

Referring to FIG. 2, the stand 200 includes the signal transmitter 210 and an electrical module 220A. The signal transmitter 210 receives a main control signal MCS from the electrical module 220A and applies the image signal ES to the signal receiver 110.

The electrical module 220A includes a display device controller 221, a broadcast receiver 222, an audio output part 223, a user input part 224, a user identifier 225, an external device interface 226, a network interface 227, a content synchronizer 228, and a storing part 229. In other exemplary embodiments, at least one of the broadcast receiver 222, the audio output part 223, the user input part 224, the user identifier 225, the external device interface 226, the network interface 227, the content synchronizer 228, and the storing part 229 may be omitted in the electrical module 220A.

The broadcast receiver 222 may receive a broadcast content and a streaming content indicating retransmission of the broadcast content. The broadcast content is provided from a broadcast station and the streaming content is provided from a streaming server. In exemplary embodiments, the streaming server may be a variety of servers that provides the broadcast content, e.g., a live broadcast, a recorded broadcast, etc., or various moving image contents in a streaming mode.

The broadcast receiver 222 includes a tuner 222A and a demodulator 222B. The tuner 222A selects a radio frequency ("RF") broadcast signal corresponding to a channel selected by the user or all predetermined channels among RF broadcast signals received through an antenna. In addition, the tuner 222A converts the selected RF signal to an intermediate signal, a base band image, or a voice signal, for example. In an exemplary embodiment, in the case where the selected RF broadcast signal is a digital broadcast signal, the tuner 222A converts the selected RF broadcast signal to a digital IF signal, and in the case where the selected RF broadcast signal is an analog broadcast signal, the tuner 222A converts the selected RF broadcast signal to an analog base band signal or the voice signal, for example. The tuner 222A processes the digital broadcast signal or the analog broadcast signal. In exemplary embodiments, the tuner 222A receives the RF broadcast signal with a single carrier according to an advanced television system committee ("ATSC") manner or the RF broadcast signal with carriers according to a digital video broadcasting ("DVB") manner, for example.

The demodulator 222B receives the converted digital intermediate frequency ("IF") signal from the tuner 222A and performs a demodulation operation on the converted digital IF signal. The demodulator 222B outputs a stream signal after performing demodulation and channel decoding. The stream signal may be obtained by multiplexing the image signal, the voice signal, or the data signal. The stream signal output from the demodulator 222B is applied to the display device controller 221.

The display device controller 221 performs a demultiplexing process, an image signal process, and a voice signal process, and then applies the image signal ES to the curved display module 100.

The audio output part 223 outputs a sound corresponding to the image displayed in the curved display module 100. The audio output part 223 receives a sound-processed signal from the display device controller 221 and outputs the sound. In an exemplary embodiment, the audio output part 223 may be provided as a speaker, for example.

The user input part 224 applies a control command generated by the user to the display device controller 221 or applies a signal provided from the display device controller 221 to the user.

In an exemplary embodiment, the user identifier 225 includes a device for recording visual images such as a camera. In an exemplary embodiment, the user identifier 225 takes a visual image (e.g., a photograph) of the user with the camera and identifies the user on the basis of the visual image. Image information taken with the camera may be input to the display device controller 221.

The external device interface 226 transmits or receives data to or from an external device connected to the external device interface 226. In exemplary embodiments, the external device interface 226 may include a wireless communication system, an audio/visual ("A/V") input/output unit, a universal serial bus ("USB") port terminal, a high definition multimedia interface ("HDMI") connection terminal, an RGB connection terminal, etc., for example. In exemplary embodiments, the external device interface 226 is connected to the external device, e.g., a digital versatile disc ("DVD"), a blue ray disc, a game unit, a camera, a camcorder, a computer, a notebook computer, a set-top box, etc., in a wire or wireless communication, and performs input and output operations with the external device. The A/V input/output unit receives the sound and image signals from the external device. The wireless communication system performs a short-range wireless communication with other electronic devices, The network interface 227 provides an interface to connect the display device 10 to a wire or wireless network provided with an internet connection. In exemplary embodiments, the network interface 227 receives contents or data provided by an internet network, a content provider, or a network operator, for example.

The content synchronizer 228 allows the image to be displayed in the curved display module 100 in synchronization with a synchronization reference time provided from a content synchronization server. The synchronization reference time is set on the basis of content identification information. In an exemplary embodiment, the content synchronizer 228 may include a memory to store the received image contents.

The storing part 229 stores a program to process and control signals in the display device controller 221 or stores the signal-processed image, voice, or data signal. The storing part 229 may temporarily store the image, voice, or data signal applied to the external device interface 226. In an exemplary embodiment, the storing part 229 may store information about broadcast channels using a channel memorizing function, e.g., a channel map.

In a conventional display device, at least one of the display device controller, the broadcast receiver, the audio output part, the user input part, the user identifier, the external device interface, the network interface, the content synchronization part, and the storing part, which are included in the electrical module, is included in the display module, so that the display module is difficult to be substantially slim.

According to the display device according to the illustrated exemplary embodiment, the electrical module used to drive the display module is included in the stand, and thus the display module may be substantially slim.

The curved display module 100 includes the signal receiver 110, an image display part DP, an image display part controller 115, a data driver 116, and a gate driver 117. The signal receiver 110 receives the image signal ES from the signal transmitter 210. The image display part DP displays the image.

The image display part controller 115 controls a drive of the data driver 116 and the gate driver 117. The image display part controller 115 receives input image signals RGB and control signals CS from the signal receiver 110. The image display part controller 115 converts a data format of the input image signals RGB to a data format appropriate to an interface between the panel controller 115 and the data driver 116 and the structure of the image display part DP to generate output image data ID and applies the output image data ID to the data driver 116.

The image display part controller 115 generates a gate control signal GCS, such as a vertical start signal, a vertical clock signal, a vertical clock bar signal, etc., and a data control signal DCS, such as an output start signal, a horizontal start signal, etc., on the basis of the control signals CS. The gate control signal GCS is applied to the gate driver 117 and the data control signal DCS is applied to the data driver 116.

The data driver 116 converts the output image data ID to data voltages in response to the data control signal DCS provided from the image display part controller 115 and outputs the data voltages. The data voltages output from the data driver 116 are applied to the image display part DP.

The gate driver 117 sequentially outputs gate signals in response to the gate control signal GCS provided from the image display part controller 115.

The image display part DP includes a plurality of gate lines GL1 to GLn, a plurality of data lines DL1 to DLm, and a plurality of pixels PX. FIG. 2 shows only first and n-th gate lines GL1 and GLn among the gate lines GL1 to GLn as a representative example. In addition, FIG. 2 shows only first and m-th data lines DL1 and DLm among the data lines DL1 to DLm as a representative example.

The gate lines GL1 to GLn are connected to the gate driver 117 to receive the gate signals from the gate driver 117. The data lines DL1 to DLm are connected to the data driver 116 to receive the data voltages from the data driver 116.

The pixels PX are arranged in a matrix form. In an exemplary embodiment, the pixels PX display at least one of primary colors of red, green, and blue colors, for example. However, the colors displayed by the pixels PX should not be limited to the red, green, and blue colors. That is, the pixels PX may further display secondary primary colors of white, yellow, cyan, and magenta colors, for example, in addition to the red, green, and blue colors.

The pixels PX display a unit image, and a resolution of the image display part DP is determined depending on the number of the pixels PX arranged in the image display part DP. FIG. 2 shows only one pixel PX as a representative example, and others are omitted.

Each pixel PX is connected to a corresponding gate line among the gate lines GL1 to GLn and a corresponding data line among the data lines DL1 to DLm.

Figure 3:
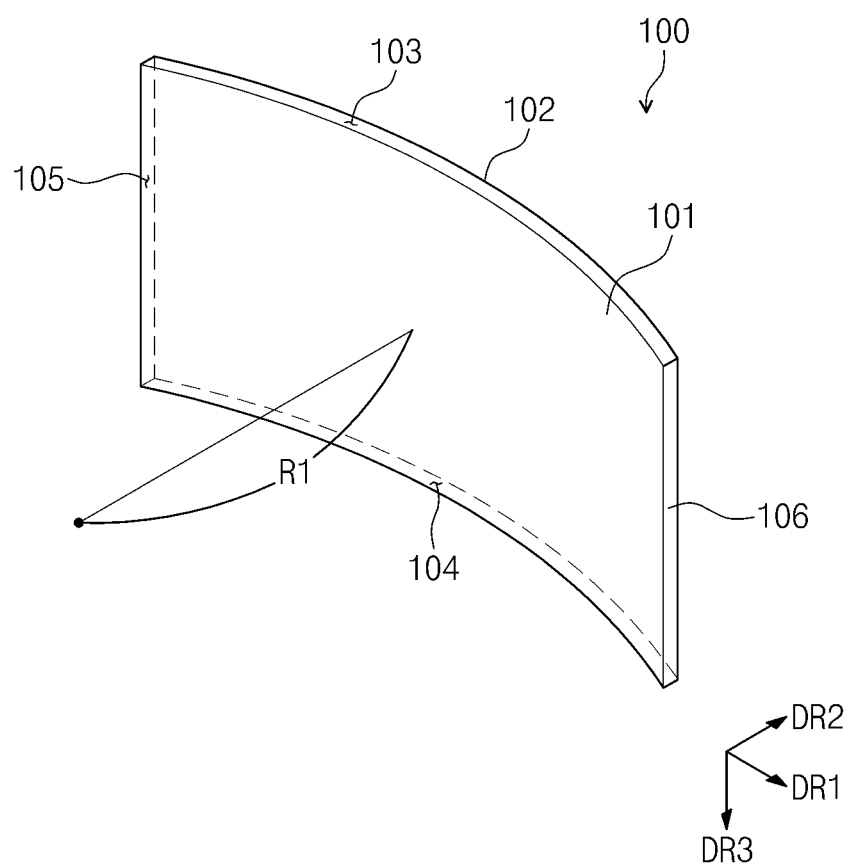
FIG. 3 is a perspective view showing a curved display module included in a display device according the invention.

FIG. 3 is a perspective view showing the curved display module 100 included in the display device 10 according to an exemplary embodiment of the invention.

Referring to FIGS. 1A, 1B, and 3, the curved display module 100 has a first curvature radius R1. In an exemplary embodiment, the first curvature radius R1 is in a range from about 2000 millimeters (mm) to about 5000 mm, for example. When the first curvature radius R1 is smaller than about 2000 mm, the image displayed in the curved display module 100 is difficult to be perceived by the user, and when the first curvature radius R1 exceeds about 5000 mm, a three-dimensional effect, immersiveness, and a presence of the image displayed through the display device 10 are degraded.

In FIG. 3, for the convenience of explanation, the curved display module 100 has a curved rectangular shape, but at least one surface of an exit surface 101, an exit rear surface 102, an upper surface 103, a lower surface 104, a first side surface 105, and a second side surface 106 of the curved display module 100 may have a stepped shape.

The curved display module 100 includes the exit surface 101, the exit rear surface 102, the upper surface 103, the lower surface 104, the first side surface 105, and the second side surface 106. The exit surface 101 is defined by one surface of the image display part DP (refer to FIG. 4A) and one surface of the frame FM (refer to FIG. 4A) surrounding the one surface of the image display part DP (refer to FIG. 4A). The exit rear surface 102 is defined by the other surface of the image display part DP (refer to FIG. 4A) and the other surface of the frame FM (refer to FIG. 4A) surrounding the other surface of the image display part DP (refer to FIG. 4A). Each of the upper surface 103, the lower surface 104, the first side surface 105, and the second side surface 106 may be a side surface connecting the one surface of the frame FM (refer to FIG. 4A) and the other surface of the frame FM (refer to FIG. 4A).

The exit surface 101 exits the image through at least a portion thereof. The exit surface 101 is curved. The exit surface 101 is concaved when viewed from the exit surface 101 to the exit rear surface direction DR2, i.e., when viewed from the point O, but it should not be limited thereto or thereby. That is, in another exemplary embodiment, the exit surface 101 may be convex when viewed from the exit surface 101 to the exit rear surface direction DR2. The exit surface 101 may have the first curvature radius R1. A portion of the exit surface 101 is accommodated in the groove GR.

The exit rear surface 102 faces the exit surface 101. A portion of the exit rear surface 102 is accommodated in the groove GR. The exit rear surface 102 is curved. The exit rear surface 102 is concaved when viewed from the exit surface 101 to the exit rear surface direction DR2, but it should not be limited thereto or thereby. That is, the exit rear surface 102 may be convex when viewed from the exit surface 101 to the exit rear surface direction DR2. Although not shown in figures, a curvature radius maintaining member may be provided to maintain the curvature radius of the other portion of the exit rear surface 102, which is not accommodated in the groove GR.

In FIGS. 1A and 3, the curvature radius of the exit surface 101 from the point O is smaller than the curvature radius of the exit rear surface 102, but it should not be limited thereto or thereby. That is, the curvature radius of the exit surface 101 may be greater than the curvature radius of the exit rear surface 102. In FIGS. 1A and 3, the exit surface 101 has substantially the same shape as that of the exit rear surface 102 and substantially the same size as that of the exit rear surface 102, but it should not be limited thereto or thereby. That is, the shape and size of the exit surface 101 may be different from the shape and size of the exit rear surface 102.

The upper surface 103 faces the lower surface 104. The upper surface 103 is connected to the exit surface 101 and the exit rear surface 102. In an exemplary embodiment, the upper surface 103 may be curved when viewed in a plan view, for example. In FIGS. 1A and 3, the upper surface 103 has substantially the same shape as that of the lower surface 104 and substantially the same size as that of the lower surface 104, but it should not be limited thereto or thereby. That is, the shape and size of the upper surface 103 may be different from those of the lower surface 104.

The lower surface 104 is connected to the exit surface 101 and the exit rear surface 102. The lower surface 104 may be curved. In an exemplary embodiment, the lower surface 104 may be curved when viewed in a plan view, for example. At least a portion of the lower surface 104 may contacts the groove GR.

The first side surface 105 is connected to the upper surface 103 and the lower surface 104. In FIGS. 1A and 3, the first side surface 105 has substantially a rectangular shape, but the shape of the first side surface 105 should not be limited to the rectangular shape. That is, the first side surface 105 may have various shapes, e.g., a trapezoid shape, a curved rectangular shape, etc.

The second side surface 106 faces the first side surface 105. The second side surface 106 is connected to the upper surface 103 and the lower surface 104. In FIGS. 1A and 3, the second side surface 106 has substantially a rectangular shape, but the shape of the second side surface 106 should not be limited to the rectangular shape. That is, in exemplary embodiments, the second side surface 106 may have various other shapes, e.g., a trapezoid shape, a curved rectangular shape, etc. In addition, the shape of the first side surface 105 is substantially the same as the shape of the second side surface 106 and the size of the shape of the first side surface 105 is substantially the same as the size of the shape of the second side surface 106, but they should not be limited thereto or thereby. That is, the shape of the first side surface 105 may be different from the shape of the second side surface 106 and the size of the shape of the first side surface 105 may be different from the size of the shape of the second side surface 106.

As described above, when the curved display module 100 receives the image signal ES (refer to FIG. 2), the image is displayed in the exit surface 101. When the curved display module 100 receives the image signal ES (refer to FIG. 2), the image may be displayed in at least one of the exit rear surface 102, the upper surface 103, the first side surface 105, and the second side surface 106.

Figure 4A:
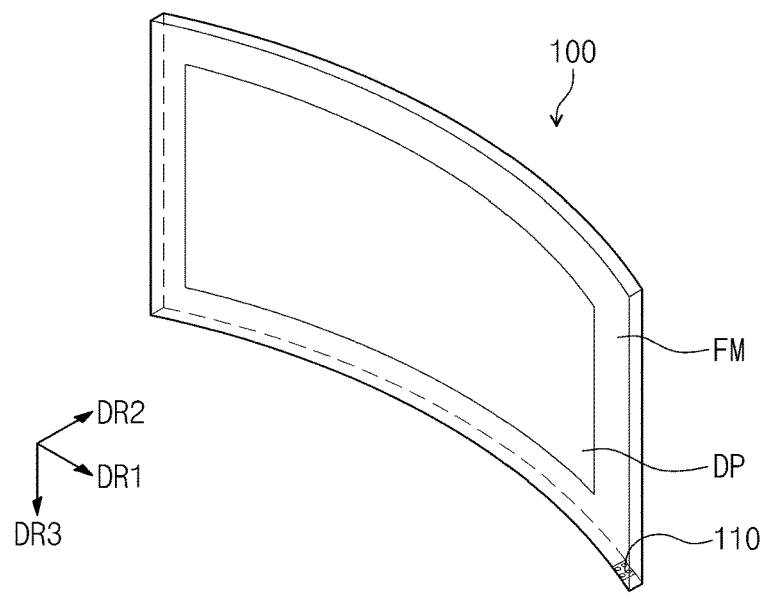
FIG. 4A is a perspective view showing an exemplary embodiment of a display module included in a display device according to the invention.
Figure 4B:
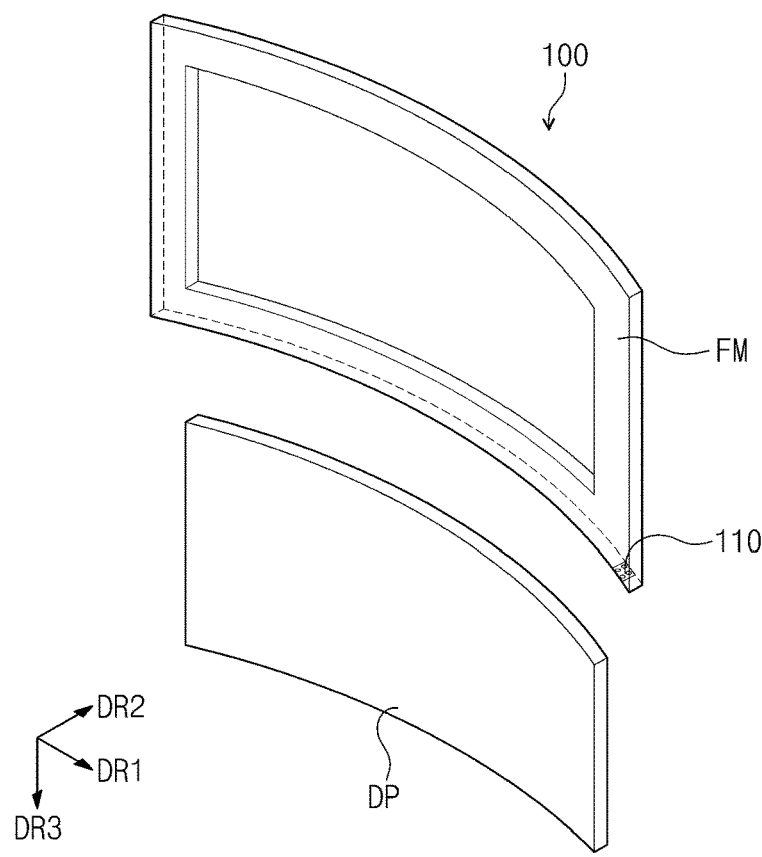
FIG. 4B is an exploded perspective view showing an exemplary embodiment of a display module included in a display device according to the invention.

FIG. 4A is a perspective view showing a curved display module 100 included in a display device according to an exemplary embodiment of the invention and FIG. 4B is an exploded perspective view the curved display module included 100 in the display device according to an exemplary embodiment of the invention.

Referring to FIGS. 4A and 4B, the curved display module 100 includes the image display part DP and the frame FM.

The image display part DP may be curved. The image display part DP may be concaved when viewed in the direction DR2 from the exit surface 101 (refer to FIG. 3) to the exit rear surface 102 (refer to FIG. 3), i.e., when viewed from the point O (refer to FIG. 3), but it should not be limited thereto or thereby. That is, the image display part DP may be convex when viewed in the direction DR2 from the exit surface 101 (refer to FIG. 3) to the exit rear surface 102 (refer to FIG. 3).

In exemplary embodiments, the image display part DP may be an organic light emitting display panel ("OLED"), a liquid crystal display panel ("LCD"), a plasma display panel, an electrophoretic display panel, a microelectromechanical system ("MEMS") display panel, or an electrowetting display panel.

The image display part DP may be rigid or flexible. In the display device 10 according to the illustrated exemplary embodiment, the display panel is curved, but the display panel may be flat according to other exemplary embodiments.

The frame FM surrounds at least a portion of an edge of the image display part DP. The frame FM maintains the shape of the image display part DP. Although not shown in figures, the frame FM may include at least one of a bottom chassis, a mold frame, and a top chassis. The signal receiver 110 is provided on a lower surface of the frame FM. At least a portion of the frame FM is accommodated in the groove GR (refer to FIG. 1A).

Figure 5A:
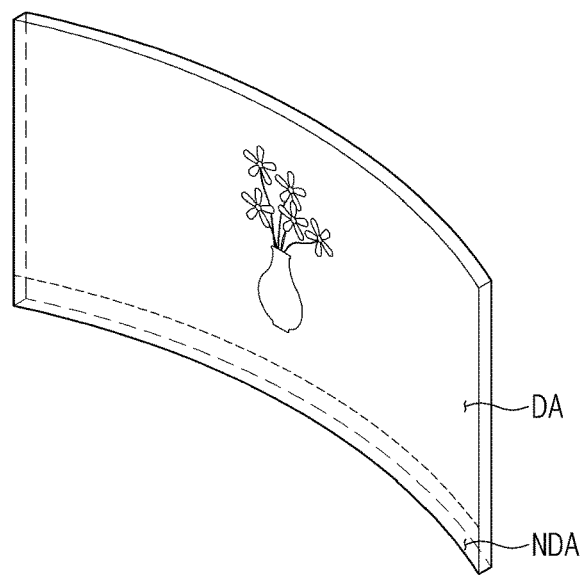
FIGS. 5A and 5B are perspective views showing an exemplary embodiment of an exit surface included in a display device according to the invention.
Figure 5B:
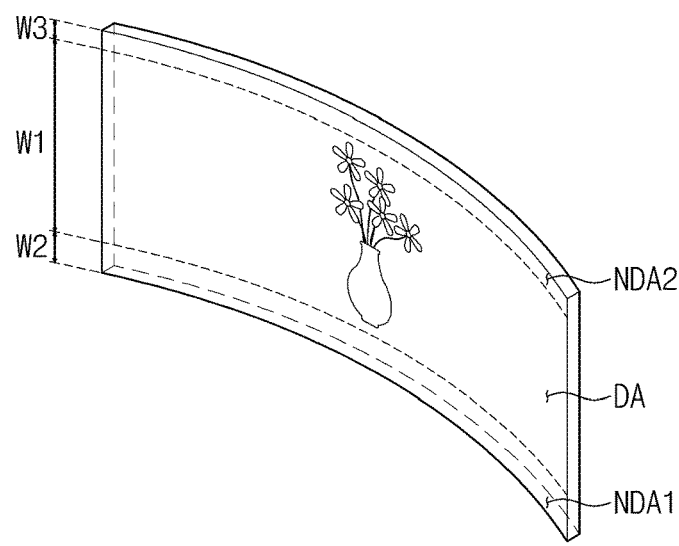

FIGS. 5A and 5B are perspective views showing the exit surface included in the display device according to an exemplary embodiment of the invention.

Referring to FIGS. 5A and 5B, the exit surface 101 includes a display area DA and a non-display area NDA in which no image is displayed. The display area DA may be one surface of the image display part DP (refer to FIG. 4A) and the non-display area NDA may be one surface of the frame FM (refer to FIG. 4A) surrounding the one surface of the image display part DP (refer to FIG. 4A), but they should not be limited thereto or thereby. That is, a portion of the one surface of the image display part DP (refer to FIG. 4A) may be included in the non-display area NDA.

The display area DA displays the image. The display area DA may be curved. In an exemplary embodiment, the display area DA may have a rectangular shape when viewed in the exit rear surface direction DR2. The display area DA includes a plurality of pixel areas (not shown). The pixel areas are arranged in a matrix form. The pixel areas (not shown) include the pixels PX (refer to FIG. 2), respectively. The non-display area NDA does not display the image. The non-display area NDA may be curved. In an exemplary embodiment, the non-display area NDA is disposed adjacent to the display area DA and has a rectangular shape when viewed in the exit rear surface direction DR2. At least a portion of the non-display area NDA is accommodated in the groove GR (refer to FIG. 1A).

Referring to FIG. 5B, the non-display area NDA includes a first sub-non-display area NDA1 and a second sub-non-display area NDA2. At least a portion of the first sub-non-display area NDA1 is accommodated in the groove GR (refer to FIG. 1A). The first sub-non-display area NDA1 may be curved. The first sub-non-display area NDA1 is disposed more adjacent to the lower surface 104 (refer to FIG. 3) of the curved display module 100 than the upper surface 103 (refer to FIG. 3) of the curved display module 100 when viewed in the exit rear surface direction DR2, and has substantially a quadrangular shape.

The second sub-non-display area NDA2 is spaced apart from the first sub-non-display area NDA1. The second sub-non-display area NDA2 is not accommodated in the groove GR (refer to FIG. 1A). The second sub-non-display area NDA2 may be curved. The second sub-non-display area NDA2 is disposed more adjacent to the upper surface 103 (refer to FIG. 3) of the curved display module 100 than the lower surface 104 (refer to FIG. 3) of the curved display module 100 when viewed in the exit rear surface direction DR2, and has substantially a quadrangular shape. The second sub-non-display area NDA2 may be omitted. That is, the non-display area NDA may be provided at only one end of the display area DA and not provided at the other end of the display area DA.

A length W1 in a vertical direction of the display area DA is greater than each of a length W2 in the vertical direction of the first sub-non-display area NDA1 and a length W3 in the vertical direction of the second sub-non-display area NDA2. In addition, the length W1 in the vertical direction of the display area DA is greater than a sum of the length W2 in the vertical direction of the first sub-non-display area NDA1 and the length W3 in the vertical direction of the second sub-non-display area NDA2.

The length W2 in the vertical direction of the first sub-non-display area NDA1 is greater than the length W3 in the vertical direction of the second sub-non-display area NDA2, but it should not be limited thereto or thereby. That is, the length W2 in the vertical direction of the first sub-non-display area NDA1 may be equal to the length W3 in the vertical direction of the second sub-non-display area NDA2.

Figure 6A:
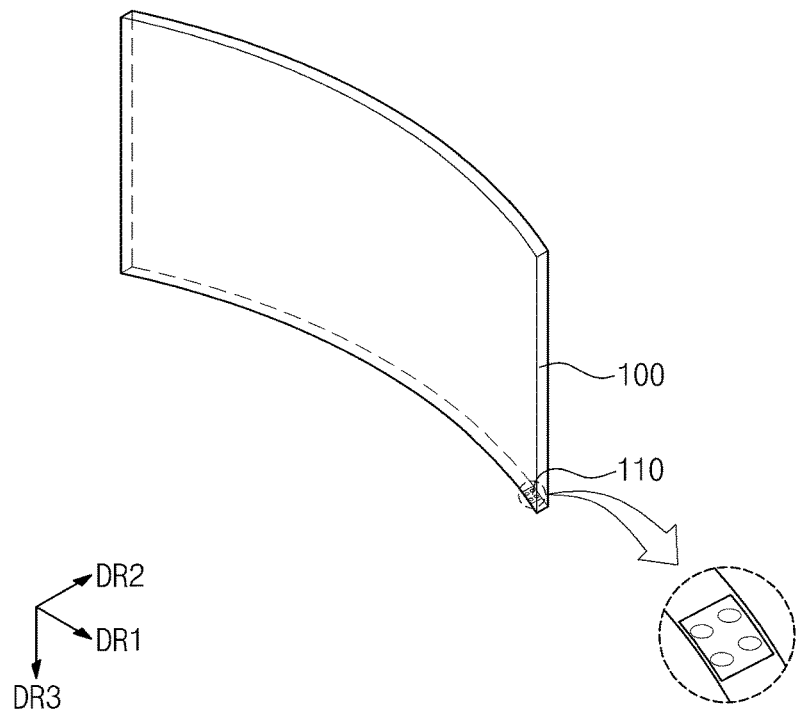
FIGS. 6A to 6C are perspective views showing an exemplary embodiment of a position of a signal receiver included in a display device according to the invention.
Figure 6B:
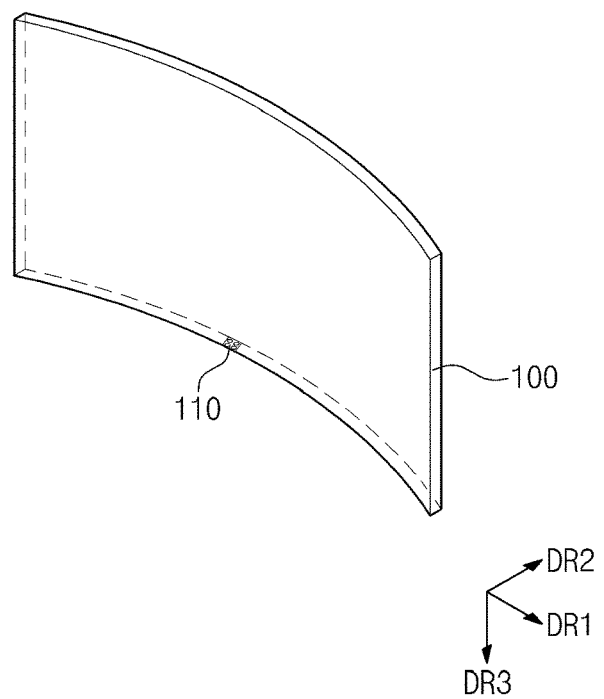
Figure 6C:
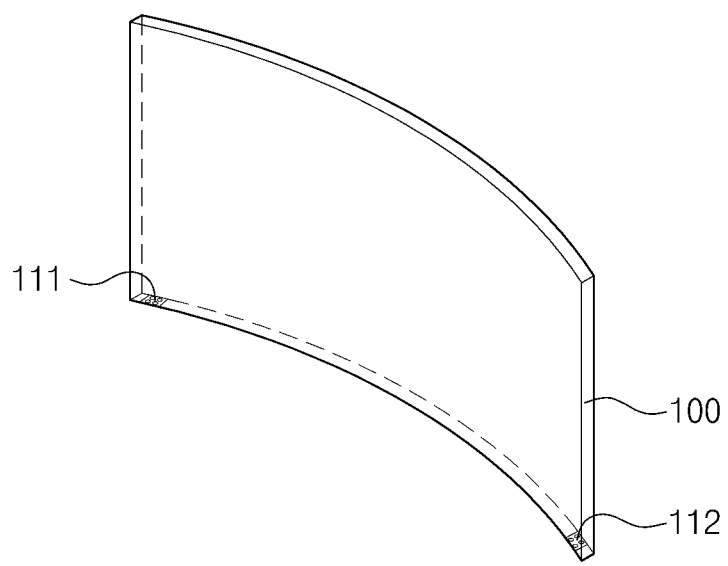
Figure 6C:
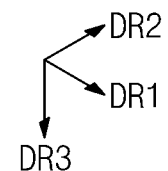

FIGS. 6A to 6C are perspective views showing a position of a signal receiver included in a display device according to an exemplary embodiment of the invention.

Referring to FIGS. 2, 3, 6A, 6B, and 6C, the curved display module 100 includes the signal receiver 110. The signal receiver 110 receives the image signal ES from the stand 200 (refer to FIG. 1A). The signal receiver 110 receives the image signal ES from the signal transmitter 210 (refer to FIG. 1A).

The signal receiver 110 is provided on the lower surface 104 of the curved display module 100. Referring to FIGS. 3 and 6A, the signal receiver 110 is disposed more adjacent to the second side surface 106 of the curved display module 100 than the first side surface 105 of the curved display module 100, but it should not be limited thereto or thereby. The signal receiver 110 is disposed more adjacent to the first side surface 105 of the curved display module 100 than the second side surface 106 of the curved display module 100 according to other exemplary embodiments. Referring to FIGS. 3 and 6B, the signal receiver 110 may be disposed at a center portion of the lower surface 104 of the curved display module 100.

Referring to FIGS. 3 and 6C, the signal receiver 110 may be provided in a plural number. In an exemplary embodiment, the signal receiver 110 may include a first signal receiver 111 and a second receiver 112, for example. The first and second signal receivers 111 and 112 may be spaced apart from each other. The first and second signal receivers 111 and 112 may be randomly disposed on an upper surface 221 (refer to FIG. 7B) of a bottom portion 220 (refer to FIG. 7B).

In FIGS. 2, 6A, 6B, and 6C, the signal receiver 110 has substantially a quadrangular shape when viewed in a plan view and includes four receiving terminals, but it should not be limited thereto or thereby. That is, the signal receiver 110 may have various shapes as long as the signal receiver 110 may receive the image signal ES provided from the stand 200.

According to the display device according to the illustrated exemplary embodiment, the signal receiver is disposed on the lower surface of the curved display module, and thus a coupling force between the signal receiver and the signal transmitter disposed on the stand may be improved due to gravity. Accordingly, defects occurring when the image signal is applied to the signal receiver from the signal transmitter may be reduced, and thus reliability of the display device may be improved.

In addition, since the signal receiver is disposed on the lower surface of the curved display module without increasing a thickness of the curved display module, the display device may be substantially slim.

Figure 7A:
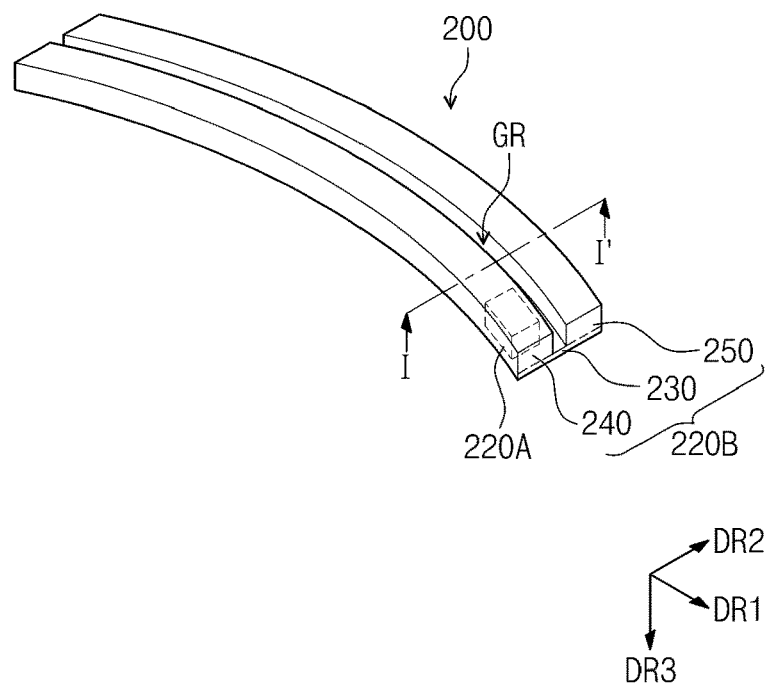
FIG. 7A is a perspective view showing an exemplary embodiment of a stand included in a display device according to the invention.
Figure 7B:
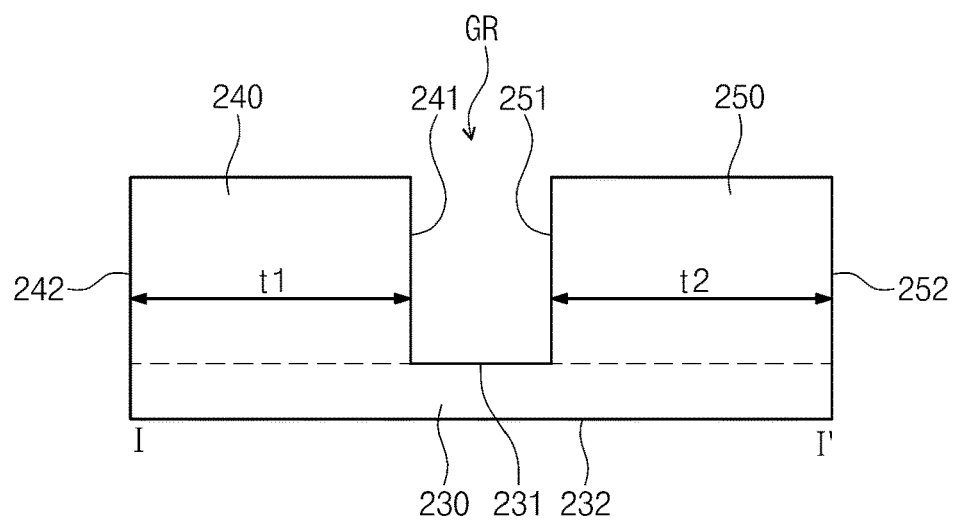
FIGS. 7B to 7D are cross-sectional views taken along line I-I' of FIG. 7A.
Figure 7C:
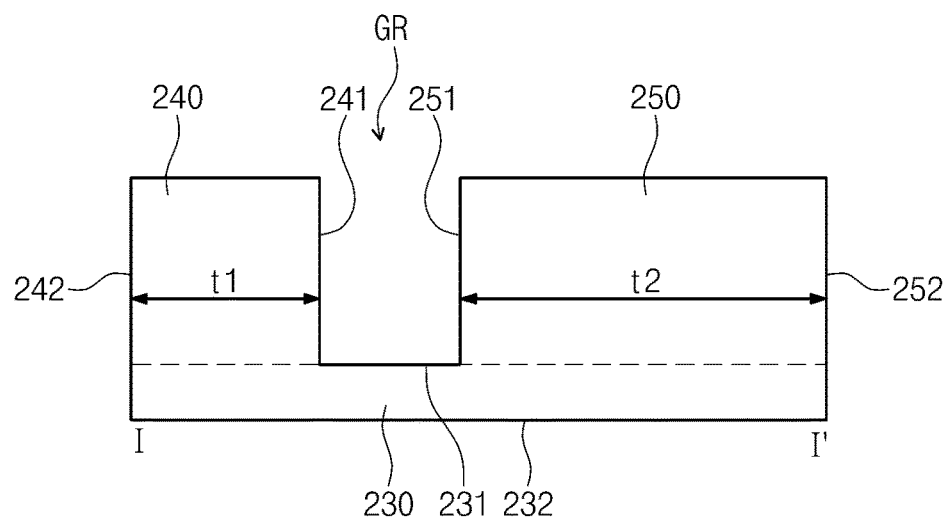
Figure 7D:
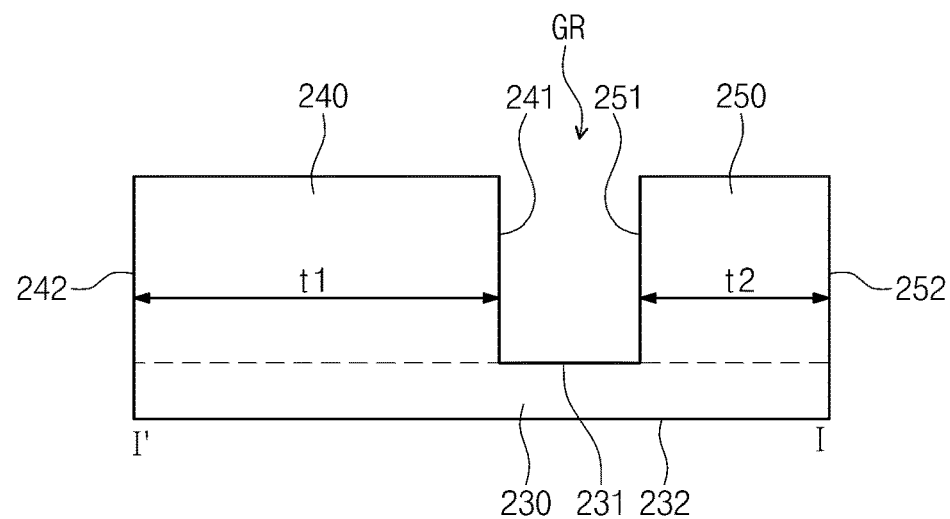

FIG. 7A is a perspective view showing a stand included in a display device according to an exemplary embodiment of the invention, FIGS. 7B to 7D are cross-sectional views taken along line I-I' of FIG. 7A, and FIGS. 8A to 8D are plan views showing stands included in a display device according to an exemplary embodiment of the invention.

Referring to FIGS. 2, 7A to 7D, and 8A to 8D, the groove GR in which the curved display module 100 is accommodated is defined in the stand 200 which provides the image signal ES.

The stand 200 includes a signal transmitter 210, electrical module 220A, and a coupling part 220B. The signal transmitter 210 receives a main control signal MCS from the electrical module 220A and applies the image signal ES to a signal receiver 110.

The electrical module 220A applies the main control signal MCS to the signal transmitter 210 to display the image in the curved display module 100. For the convenience of explanation, FIG. 7A shows the electrical module 220A having a rectangular shape that is curved and has a thick thickness, but the electrical module 220A may be provided in a chip form with a thin thickness according to other exemplary embodiments. In addition, the electrical module 220A may be randomly placed as long as the electrical module 220A is accommodated in the coupling part 220B. For the convenience of explanation, the electrical module 220A is shown as one member in FIG. 7A, but the electrical module 220A may be configured to include plural members.

The coupling part 220B accommodates the electrical module 220A therein. The coupling part 220B includes a bottom portion 230, a first sidewall portion 240, and a second sidewall portion 250. The groove GR is defined by an upper surface 231, an inner surface 241 of the first sidewall portion 250, and an inner surface 251 of the second sidewall portion 250. A lower surface 232 of the bottom portion 230 is connected to an outer surface 242 of the first sidewall portion 240 and an outer surface 252 of the second sidewall portion 250.

The upper surface 231 of the bottom portion 230 is exposed to the outside. The upper surface 231 of the bottom portion 230 is overlapped with the curved display module 100 when viewed in a plan view. The first sidewall portion 240 is connected to the bottom portion 230. A portion of the inner surface 241 of the first sidewall portion 240 contacts the bottom portion 230 and the other portion of the inner surface 241 of the first sidewall portion 240 is exposed to the outside. The first sidewall portion 240 is overlapped with a portion of the curved display module 100 (refer to FIG. 3) when viewed in the exit rear surface direction DR2. The first sidewall portion 240 is overlapped with a portion of the exit surface 101 (refer to FIG. 3) and a portion of the exit rear surface 102 (refer to FIG. 3) when viewed in the exit rear surface direction DR2.

Referring to FIGS. 7A to 7D and 8A to 8D, the first sidewall portion 240 is curved. The inner surface 241 of the first sidewall portion 240 is curved. The inner surface 241 of the first sidewall portion 240 may be a curved surface. Referring to FIGS. 7A to 7D and 8A to 8C, the outer surface 242 of the first sidewall portion 240 is curved. The outer surface 242 of the first sidewall portion 240 may be a curved surface. However, referring to FIG. 8D, the inner surface 241 of the first sidewall portion 240 may be curved and the outer surface 242 of the first sidewall portion 240 may be flat. Accordingly, the inner surface 241 of the first sidewall portion 240 may be the curved surface and the outer surface 242 of the first sidewall portion 240 may be a flat surface.

Referring to FIGS. 7A to 7D and 8A to 8C, a distance t1 between the inner surface 241 and the outer surface 242 of the first sidewall portion 240 is constant, but it should not be limited thereto or thereby. Referring to FIG. 8D, the distance t1 between the inner surface 241 and the outer surface 242 of the first sidewall portion 240 may not be constant. In an exemplary embodiment, the distance t1 between the inner surface 241 and the outer surface 242 of the first sidewall portion 240 decreases as a distance from an end of the first sidewall portion 240 decreases when viewed in a plan view, for example.

Referring to FIGS. 7A to 7D and 8A to 8D, the second sidewall portion 250 is spaced apart from the first sidewall portion 240. The second sidewall portion 250 is connected to the bottom portion 230. A portion of the inner surface 251 of the second sidewall portion 250 contacts the bottom portion 230 and the other portion of the inner surface 251 of the second sidewall portion 250 is exposed to the outside. The second sidewall portion 250 is overlapped with a portion of the curved display module 100 when viewed in the exit rear surface direction DR2. The second sidewall portion 250 is overlapped with a portion of the exit surface 101 (refer to FIG. 3) and a portion of the exit rear surface 102 (refer to FIG. 3) when viewed in the exit rear surface direction DR2.

Referring to FIGS. 7A and 8A to 8D, the second sidewall portion 250 is curved. The inner surface 251 of the second sidewall portion 250 is curved. The inner surface 251 of the second sidewall portion 250 may be a curved surface. Referring to FIGS. 7A and 8A to 8C, the outer surface 252 of the second sidewall portion 250 is curved. The outer surface 252 of the second sidewall portion 250 may be a curved surface. However, referring to FIG. 8D, the inner surface 251 of the second sidewall portion 250 may be curved and the outer surface 252 of the second sidewall portion 250 may be flat. Accordingly, the inner surface 251 of the second sidewall portion 250 may be the curved surface and the outer surface 252 of the second sidewall portion 250 may be a flat surface.

Referring to FIGS. 7A to 7D and 8A to 8C, a distance t2 between the inner surface 251 and the outer surface 252 of the second sidewall portion 250 is constant, but it should not be limited thereto or thereby. Referring to FIG. 8D, the distance t2 between the inner surface 251 and the outer surface 252 of the second sidewall portion 250 may not be constant. In an exemplary embodiment, the distance t2 between the inner surface 251 and the outer surface 252 of the second sidewall portion 250 decreases as a distance from an end of the second sidewall portion 240 decreases when viewed in a plan view, for example.

Figure 8A:
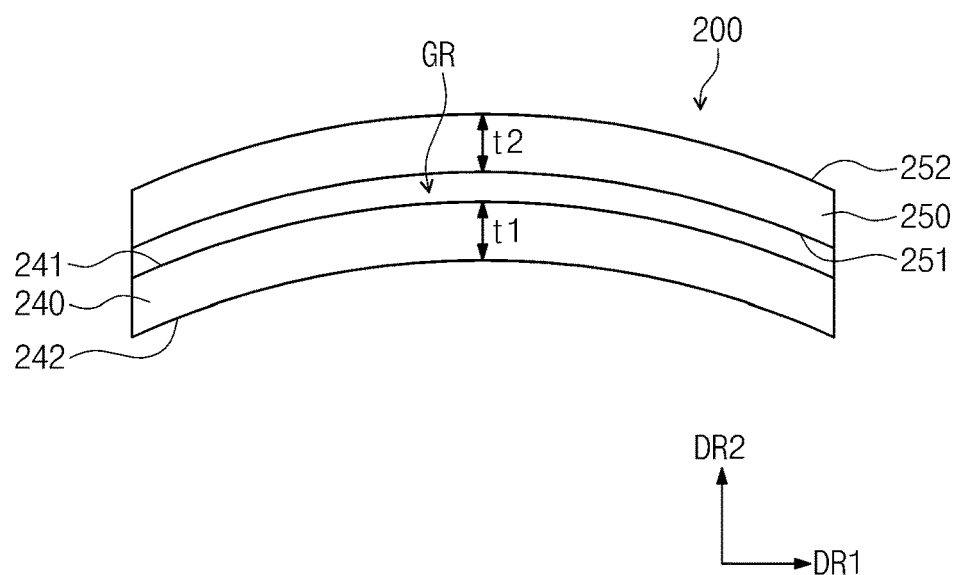
FIGS. 8A to 8D are plan views showing an exemplary embodiment of stands included in a display device according to the invention.
Figure 8B:
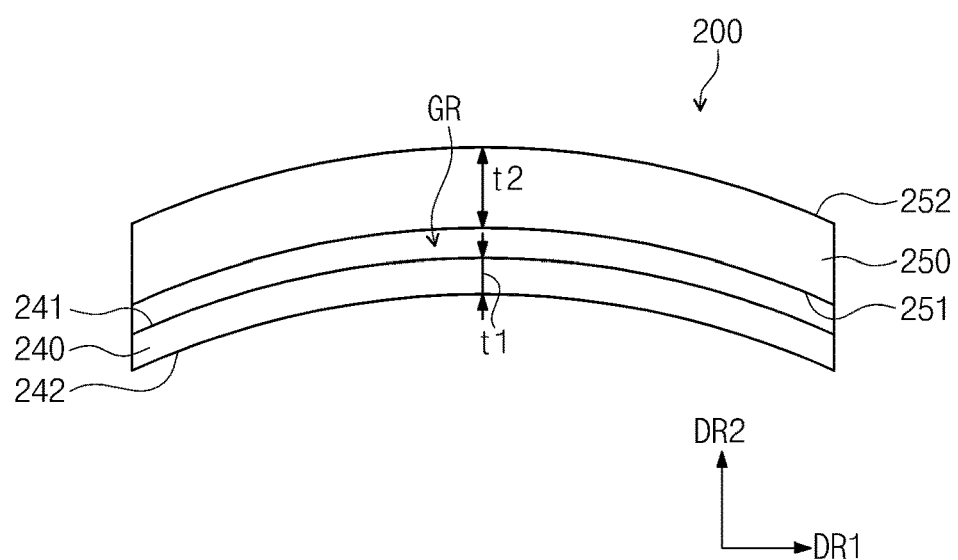
Figure 8C:
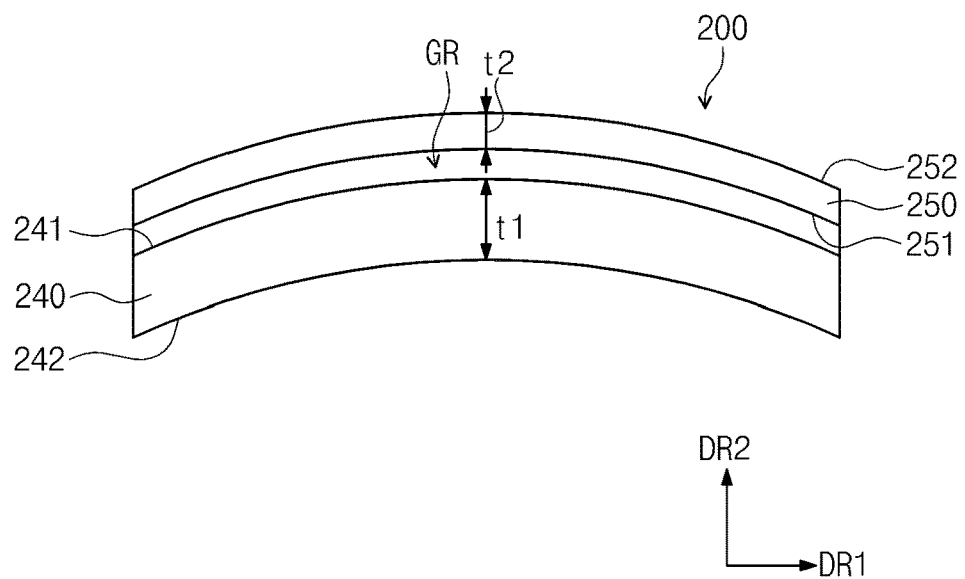
Figure 8D:
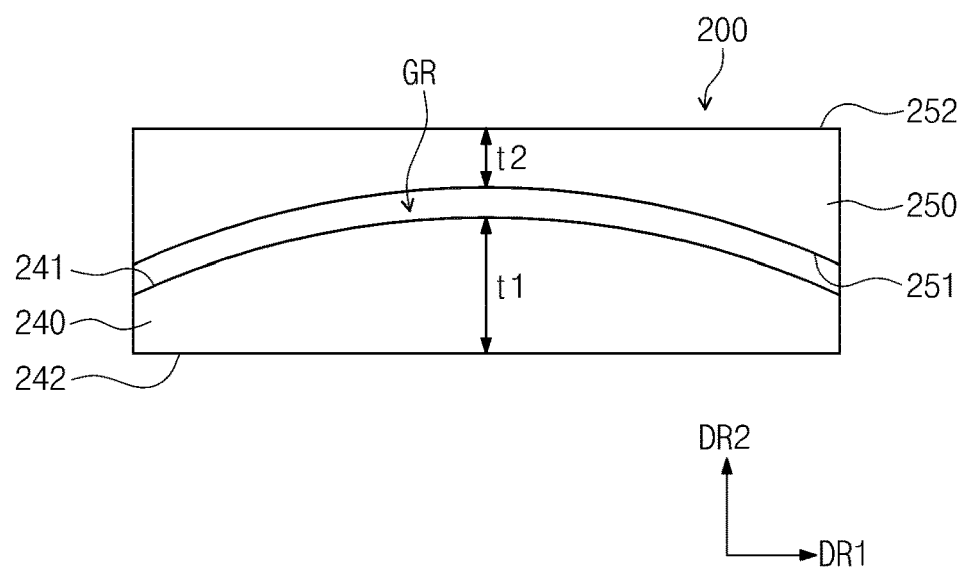

Referring to FIGS. 7A, 7B, and 8A, the distance t1 between the inner surface 241 and the outer surface 242 of the first sidewall portion 240 in the exit rear surface direction DR2 may substantially the same as the distance t2 between the inner surface 251 and the outer surface 252 of the second sidewall portion 250 in the exit rear surface direction DR2, but it should not be limited thereto or thereby. Referring to FIGS. 7C, 7D, 8B, and 8C, the distance t1 between the inner surface 241 and the outer surface 242 of the first sidewall portion 240 in the exit rear surface direction DR2 may be different from the distance t2 between the inner surface 251 and the outer surface 252 of the second sidewall portion 250 in the exit rear surface direction DR2. Referring to FIGS. 7C and 8B, the distance t1 between the inner surface 241 and the outer surface 242 of the first sidewall portion 240 in the exit rear surface direction DR2 may be less than the distance t2 between the inner surface 251 and the outer surface 252 of the second sidewall portion 250 in the exit rear surface direction DR2. Referring to FIGS. 7D and 8C, the distance t1 between the inner surface 241 and the outer surface 242 of the first sidewall portion 240 in the exit rear surface direction DR2 may be greater than the distance t2 between the inner surface 251 and the outer surface 252 of the second sidewall portion 250 in the exit rear surface direction DR2.

The distance t1 between the inner surface 241 and the outer surface 242 of the first sidewall portion 240 may be greater than a shortest distance between the exit surface 101 (refer to FIG. 3) and the exit rear surface 102 (refer to FIG. 3). The distance t2 between the inner surface 251 and the outer surface 252 of the second sidewall portion 250 may be greater than a shortest distance between the exit surface 101 (refer to FIG. 3) and the exit rear surface 102 (refer to FIG. 3). However, according to other exemplary embodiments, at least one of the distance t1 between the inner surface 241 and the outer surface 242 of the first sidewall portion 240 and the distance t2 between the inner surface 251 and the outer surface 252 of the second sidewall portion 250 may be equal to or less than the shortest distance between the exit surface 101 (refer to FIG. 3) and the exit rear surface 102 (refer to FIG. 3).

Figure 9A:
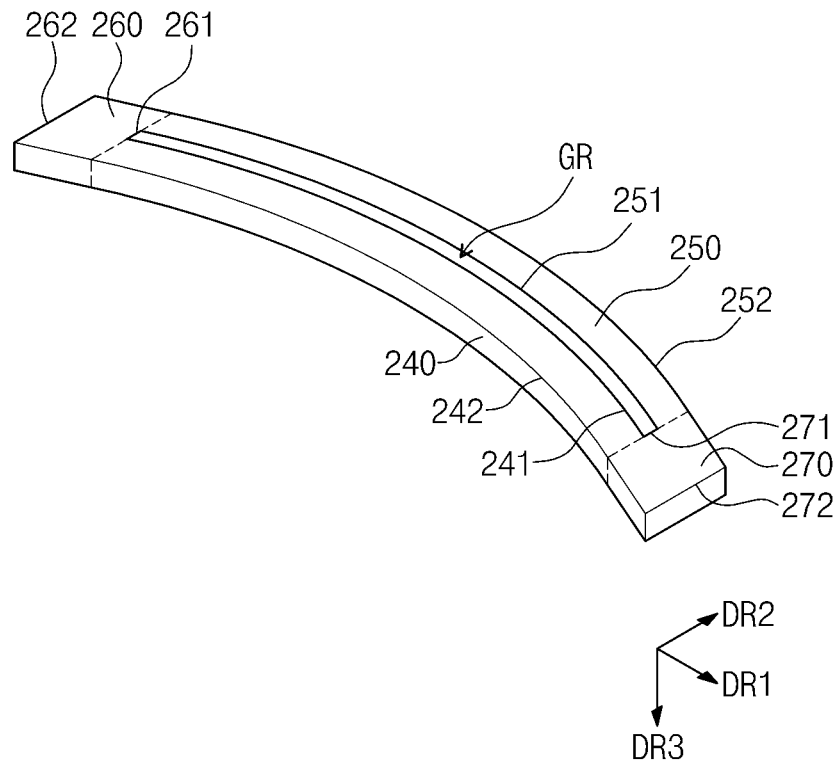
FIG. 9A is a perspective view showing an exemplary embodiment of a stand included in a display device according to the invention.

FIG. 9A is a perspective view showing a stand included in a display device according to an exemplary embodiment of the invention and FIGS. 9B to 9E are plan views showing stands included in a display device according to an exemplary embodiment of the invention.

Referring to FIGS. 9A to 9E, the coupling part 220B (refer to FIG. 7A) includes a bottom portion 230 (refer to FIG. 7A), a first sidewall portion 240, a second sidewall portion 250, a first connection portion 260, and a second connection portion 270. The groove GR is defined by an upper surface 231 (refer to FIG. 7B to 7D) of the bottom portion 230, an inner surface 241 of the first sidewall portion 240, an inner surface 251 of the second sidewall portion 250, an inner surface 261 of the first connection portion 260, and an inner surface 271 of the second connection portion 270. A lower surface 232 (refer to FIG. 7B to 7D) of the bottom portion 230 is connected to an outer surface 242 of the first sidewall portion 240, an outer surface 252 of the second sidewall portion 250, an outer surface 262 of the first connection portion 260, and an outer surface 272 of the second connection portion 270.

The first connection portion 260 connects the first and second sidewall portions 240 and 250. The first connection portion 260 is overlapped with a portion of the curved display module 100 when viewed in the side surface direction DR1. The first connection portion 260 is overlapped with a portion of the first side surface 105 (refer to FIG. 3) and a portion of the second side surface 106 (refer to FIG. 3) when viewed in the side surface direction DR1 from the first side surface 105 (refer to FIG. 3) to the second side surface 106 (refer to FIG. 3).

The second connection portion 270 faces the first connection portion 260. The second connection portion 270 connects the first and second sidewall portions 240 and 250. The second connection portion 270 is overlapped with a portion of the curved display module 100 when viewed in the side surface direction DR1. The second connection portion 270 is overlapped with a portion of the first side surface 105 (refer to FIG. 3) and a portion of the second side surface 106 (refer to FIG. 3) when viewed in the side surface direction DR1 from the first side surface 105 (refer to FIG. 3) to the second side surface 106 (refer to FIG. 3).

In FIGS. 9A to 9E, a length WL1 in a horizontal direction of the first connection portion 260 is equal to a length WL2 in a horizontal direction of the second connection portion 270, but it should not be limited thereto or thereby. That is, the length WL1 in the horizontal direction of the first connection portion 260 may be different from the length WL2 in the horizontal direction of the second connection portion 270. In an exemplary embodiment, the length WL1 in the horizontal direction of the first connection portion 260 may be greater than or less than the length WL2 in the horizontal direction of the second connection portion 270, for example.

The first sidewall portion 240 is connected to the bottom portion 230. A portion of the inner surface 241 of the first sidewall portion 240 contacts the bottom portion 230 and the other portion of the inner surface 241 of the first sidewall portion 240 is exposed to the outside. The first sidewall portion 240 is overlapped with a portion of the curved display module 100 when viewed in the exit rear surface direction DR2. The first sidewall portion 240 is overlapped with a portion of the exit surface 101 and a portion of the exit rear surface 102 when viewed in the exit rear surface direction DR2.

Referring to FIGS. 9A to 9E, the first sidewall portion 240 may be curved. Referring to FIGS. 9A to 9D, the inner surface 241 of the first sidewall portion 240 may be curved. The inner surface 241 of the first sidewall portion 240 may be a curved surface. The outer surface 242 of the first sidewall portion 240 may be curved. The outer surface 242 of the first sidewall portion 240 may be a curved surface. However, referring to FIG. 9E, the inner surface 241 of the first sidewall portion 240 may be curved and the outer surface 242 of the first sidewall portion 240 may be flat. In an alternative exemplary embodiment, the outer surface 242 of the first sidewall portion 240 may be the curved surface and the outer surface 242 of the first sidewall portion 240 may be the flat surface.

Referring to FIGS. 9A to 9D, a distance t1 between the inner surface 241 and the outer surface 242 of the first sidewall portion 240 may be constant, but it should not be limited thereto or thereby. That is, the distance t1 between the inner surface 241 and the outer surface 242 of the first sidewall portion 240 may not be constant. In an exemplary embodiment, the distance t1 between the inner surface 241 and the outer surface 242 of the first sidewall portion 240 may be decreased as a distance from an end of the first sidewall portion 240 decreases, for example.

Referring to FIGS. 9A to 9E, the second sidewall portion 250 is spaced apart from the first sidewall portion 240. The second sidewall portion 250 is connected to the bottom portion 230. The second sidewall portion 250 is overlapped with a portion of the curved display module 100 when viewed in the exit rear surface direction DR2. The second sidewall portion 250 is overlapped with a portion of the exit surface 101 and a portion of the exit rear surface 102 when viewed in the exit rear surface direction DR2.

Referring to FIGS. 9A to 9E, the second sidewall portion 250 may be curved. The inner surface 251 of the second sidewall portion 250 may be curved. The inner surface 251 of the second sidewall portion 250 may be a curved surface. Referring to FIGS. 9A to 9D, the outer surface 252 of the second sidewall portion 250 may be curved. The outer surface 252 of the second sidewall portion 250 may be a curved surface. However, referring to FIG. 9E, the inner surface 251 of the second sidewall portion 250 may be curved and the outer surface 252 of the second sidewall portion 250 may be flat. In an exemplary embodiment, the outer surface 252 of the second sidewall portion 250 may be the curved surface and the outer surface 252 of the second sidewall portion 250 may be the flat surface.

Referring to FIGS. 9A to 9D, a distance t2 between the inner surface 251 and the outer surface 252 of the second sidewall portion 250 may be constant, but it should not be limited thereto or thereby. Referring to FIG. 9E, the distance t2 between the inner surface 251 and the outer surface 252 of the second sidewall portion 250 may not be constant. In an exemplary embodiment, the distance t2 between the inner surface 251 and the outer surface 252 of the second sidewall portion 250 may be decreased as a distance from an end of the second sidewall portion 250 decreases, for example.

Figure 9B:
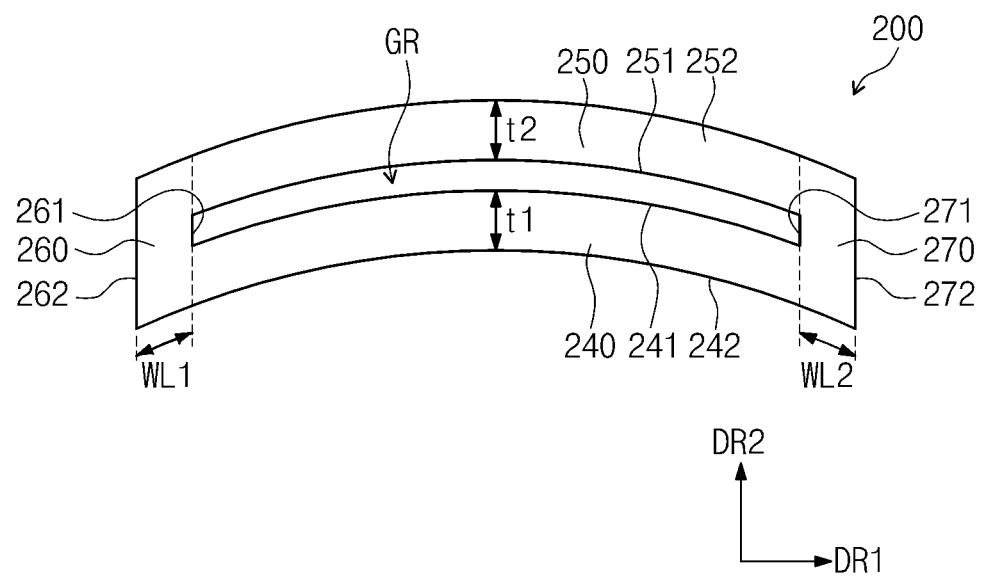
FIGS. 9B to 9E are plan views showing an exemplary embodiment of stands included in a display device according to the invention.
Figure 9C:
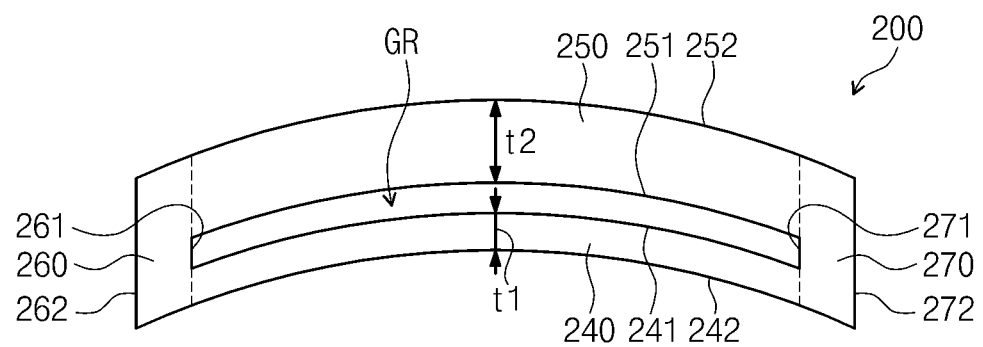
Figure 9D:
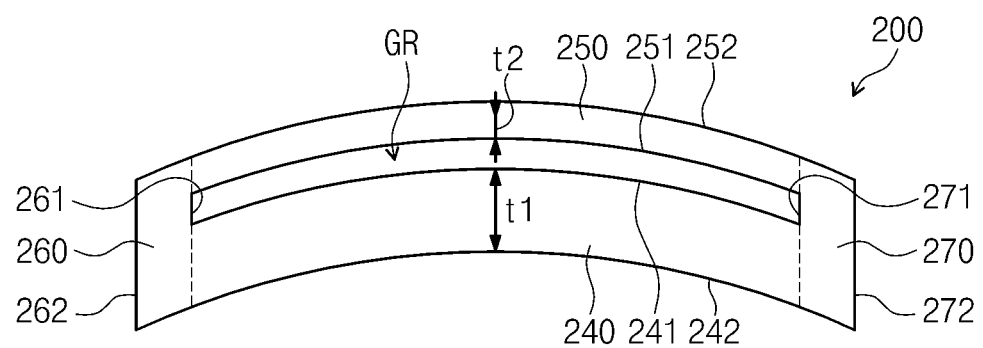
Figure 9E:
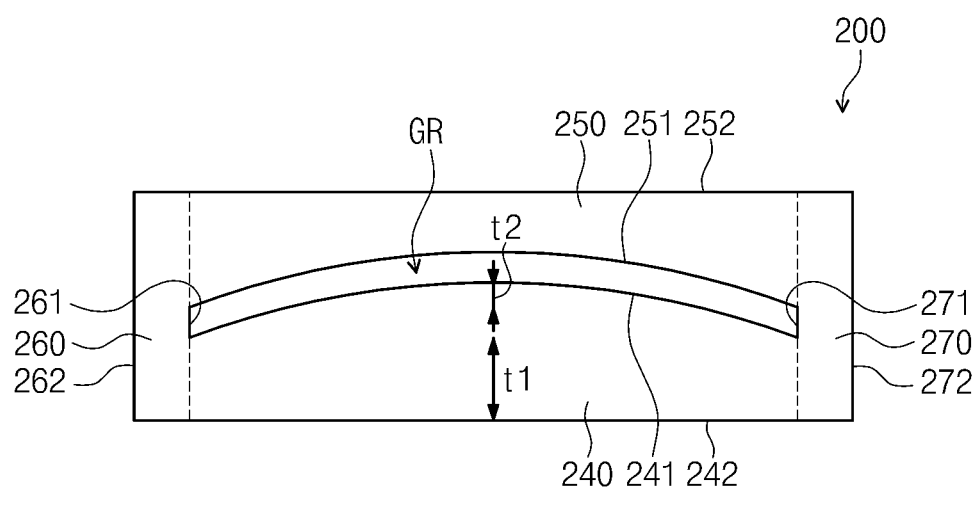
Figure 9E:
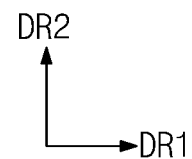

Referring to FIGS. 9A and 9B, the distance t1 between the inner and outer surfaces 241 and 242 of the first sidewall portion 240 may be equal to the distance t2 between the inner and outer surfaces 251 and 252 of the second sidewall portion 250, but it should not be limited thereto or thereby. Referring to FIGS. 9C and 9D, the distance t1 between the inner and outer surfaces 241 and 242 of the first sidewall portion 240 may be different from the distance t2 between the inner and outer surfaces 251 and 252 of the second sidewall portion 250. Referring to FIG. 9C, the distance t1 between the inner and outer surfaces 241 and 242 of the first sidewall portion 240 may be less than the distance t2 between the inner and outer surfaces 251 and 252 of the second sidewall portion 250. Referring to FIG. 9D, the distance t1 between the inner and outer surfaces 241 and 242 of the first sidewall portion 240 may be greater than the distance t2 between the inner and outer surfaces 251 and 252 of the second sidewall portion 250.

Figure 10A:
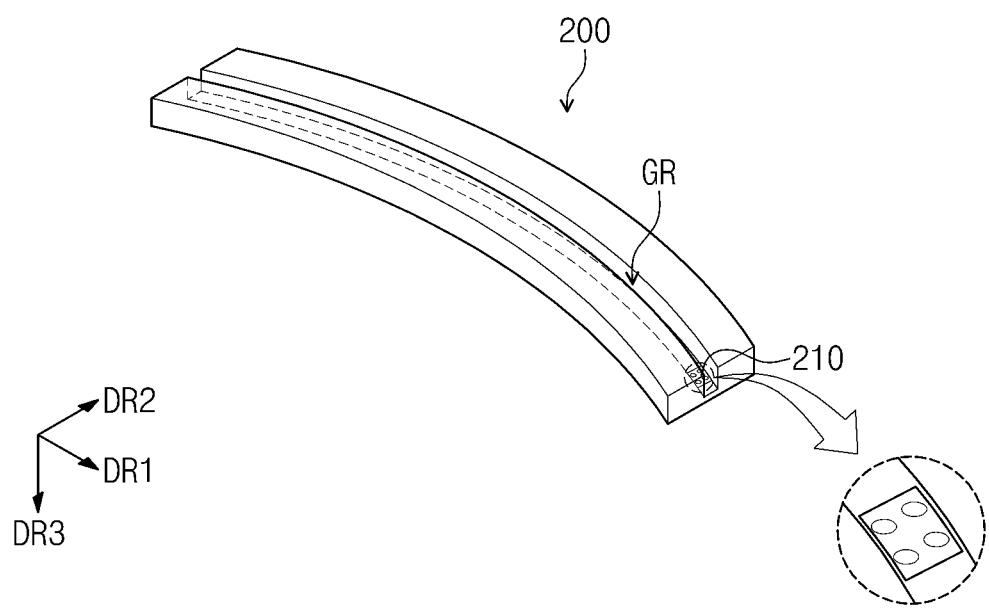
FIGS. 10A to 10C are perspective views showing an exemplary embodiment of positions of signal receivers included in a display device according to the invention.
Figure 10B:
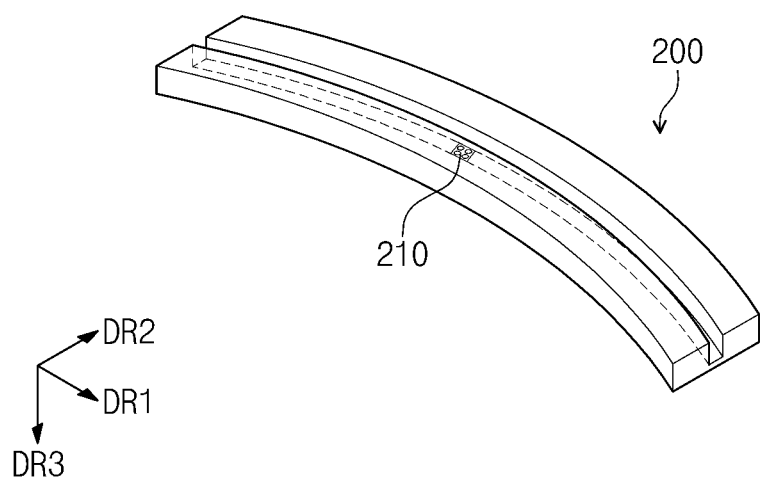
Figure 10C:
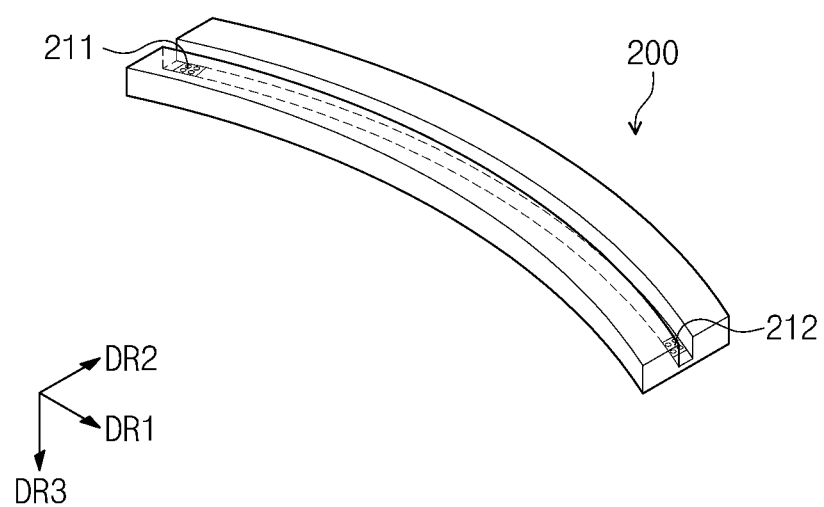

FIGS. 10A to 10C are perspective views showing positions of signal receivers included in a display device according to an exemplary embodiment of the invention.

Referring to FIGS. 2 and 10A to 10C, the stand 200 includes the signal transmitter 210 electrically connected to the signal receiver 110. The signal transmitter 210 applies the image signal ES to the signal receiver 110.

The signal transmitter 210 may be disposed on the upper surface 231 (refer to FIGS. 7B to 7D) of the bottom portion 230. Referring to FIG. 10A, the signal transmitter 210 is disposed more adjacent to one side portion of the upper surface 231 of the bottom portion 230 than a center portion of the upper surface 231 of the bottom portion 230, but it should not be limited thereto or thereby. Referring to FIG. 10B, the signal transmitter 210 may be disposed at a center portion of the bottom portion 230. Referring to FIG. 10C, the signal transmitter 210 may be provided in a plural number. In an exemplary embodiment, the signal transmitter 210 may include a first signal transmitter 211 and a second signal transmitter 212. The first and second signal transmitters 211 and 212 may be spaced apart from each other, for example. In an exemplary embodiment, the first and second signal transmitters 211 and 212 may be opposite to each other with reference to the center portion of the stand 200. However, the invention is not limited thereto, and the first and second signal transmitters 211 and 212 may be randomly disposed on the upper surface 231 of the bottom portion 230.

In FIGS. 10A to 10C, the signal transmitter 210 has substantially quadrangular shape when viewed in a plan view and includes eight transmitting terminals, but it should not be limited thereto or thereby.

FIGS. 11A to 11D are perspective views showing relations between the display module 100 and the stand 200, which are included in the display device 10 according to an exemplary embodiment of the invention.

Figure 11A:
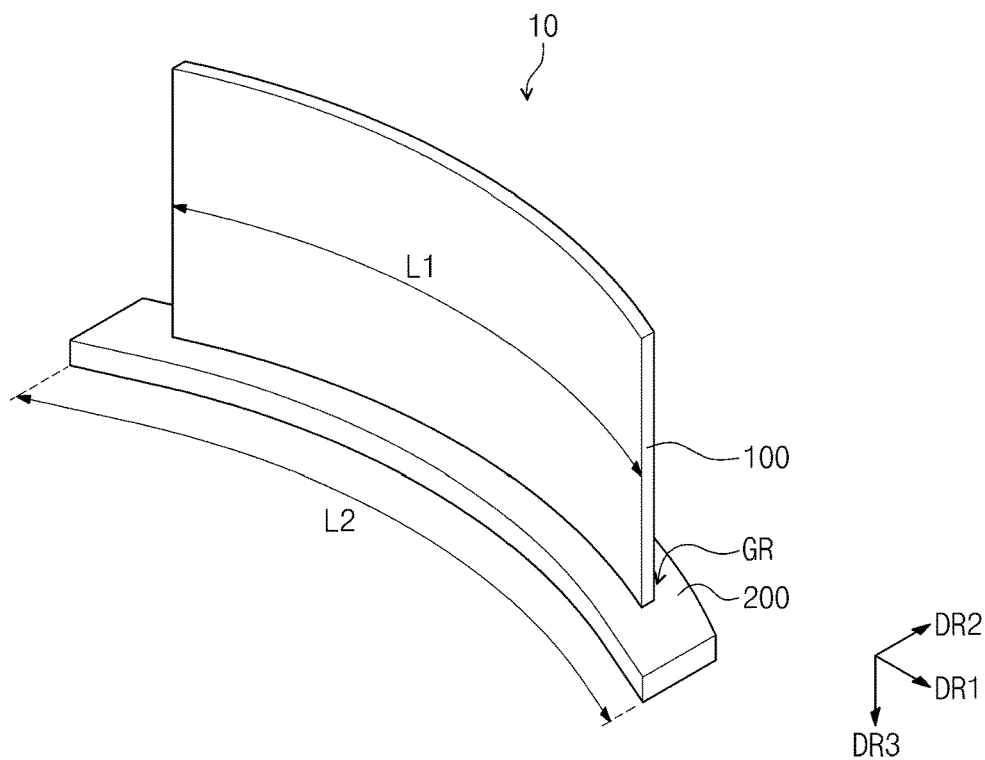
FIGS. 11A to 11D are perspective views showing an exemplary embodiment of relations between a display module and a stand, which are included in a display device according to the invention.
Figure 11B:
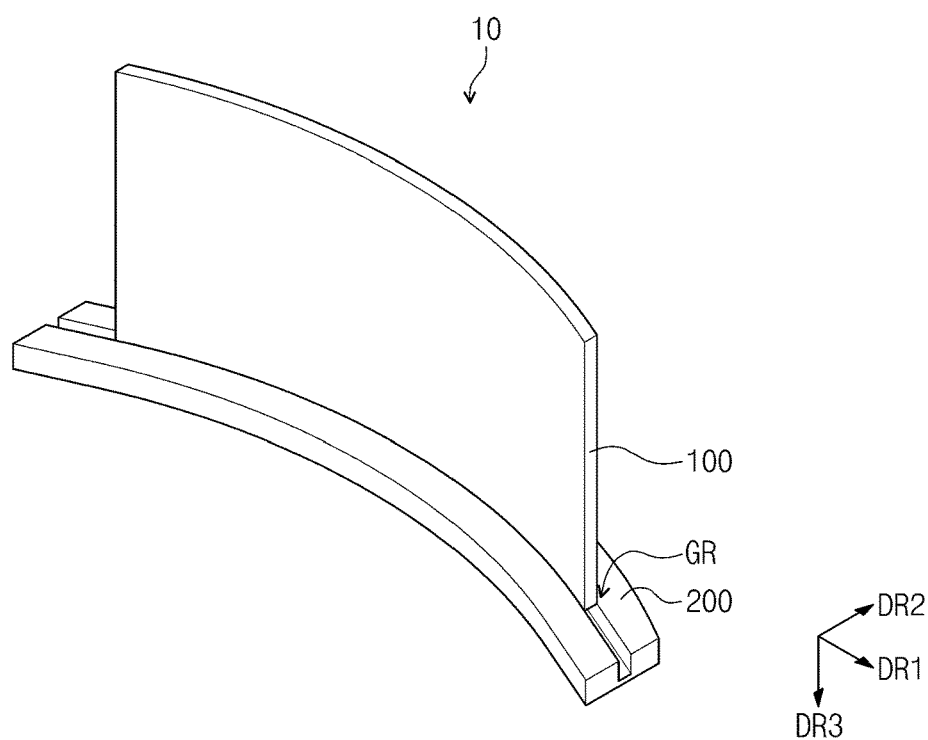
Figure 11C:
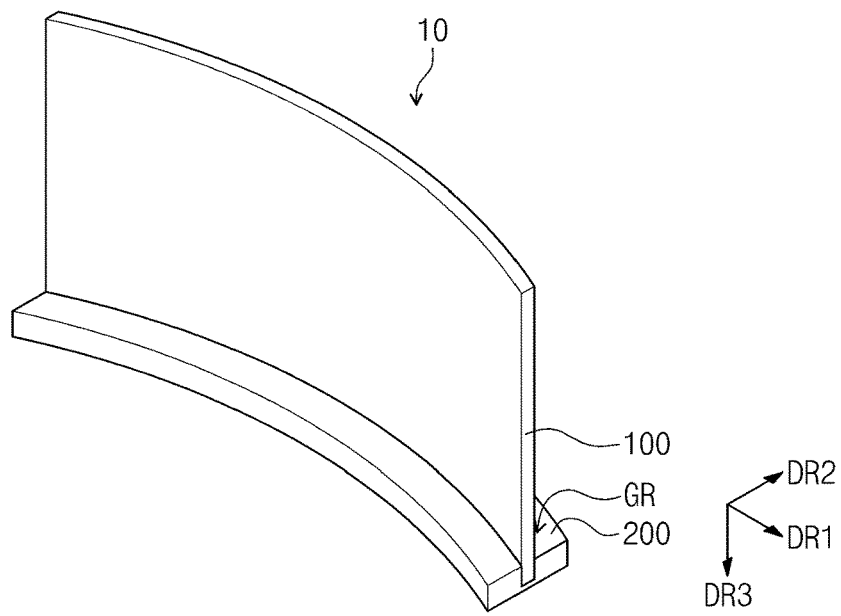
Figure 11D:
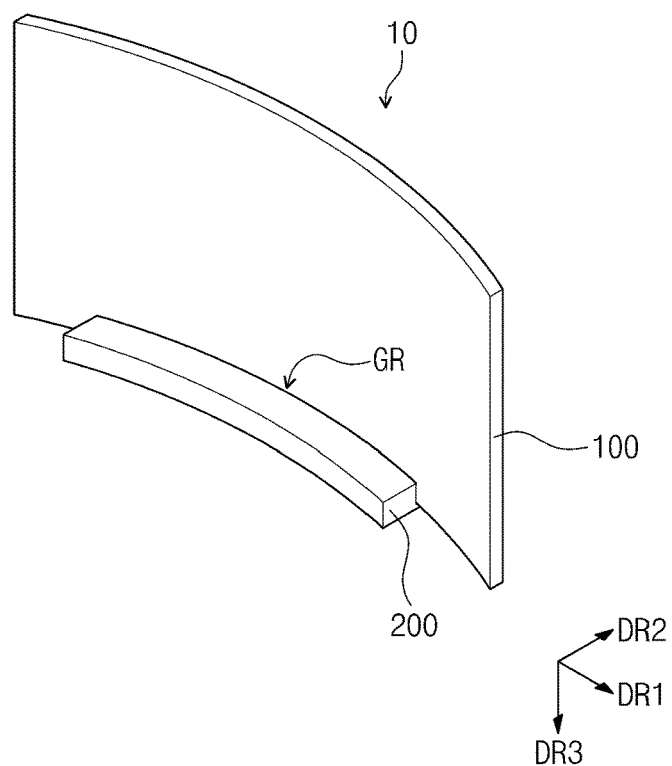

Referring to FIGS. 11A to 11C, a length L2 in a horizontal direction of the stand 200 is equal to or greater than about ⅔ and equal to or smaller than about 5/3 of a length L1 in the horizontal direction of the curved display module 100. In the case where the length L2 in the horizontal direction of the stand 200 is smaller than about ⅔ of the length L1 in the horizontal direction of the curved display module 100, the curved display module 100 easily moves by an external force. In the case where the length L2 in the horizontal direction of the stand 200 exceeds about 5/3 of the length L1 in the horizontal direction of the curved display module 100, the stand 200 takes up excessive space, and thus the stand 200 is difficult to be a useful appliance. In an exemplary embodiment, referring to FIGS. 11A and 11B, the length L1 in the horizontal direction of the stand 200 may be greater than the length L1 in the horizontal direction of the curved display module 100, for example. Referring to FIG. 11A, the groove GR is defined by four side surfaces and one bottom surface, and referring to FIG. 11B, the groove GR is defined by two side surfaces and one bottom surface. Referring to FIG. 11C, the length L2 in the horizontal direction of the stand 200 may be equal to the length L1 in the horizontal direction of the curved display module 100. Referring to FIG. 11D, the length L2 in the horizontal direction of the stand 200 may be less than the length L1 in the horizontal direction of the curved display module 100.

Figure 12A:
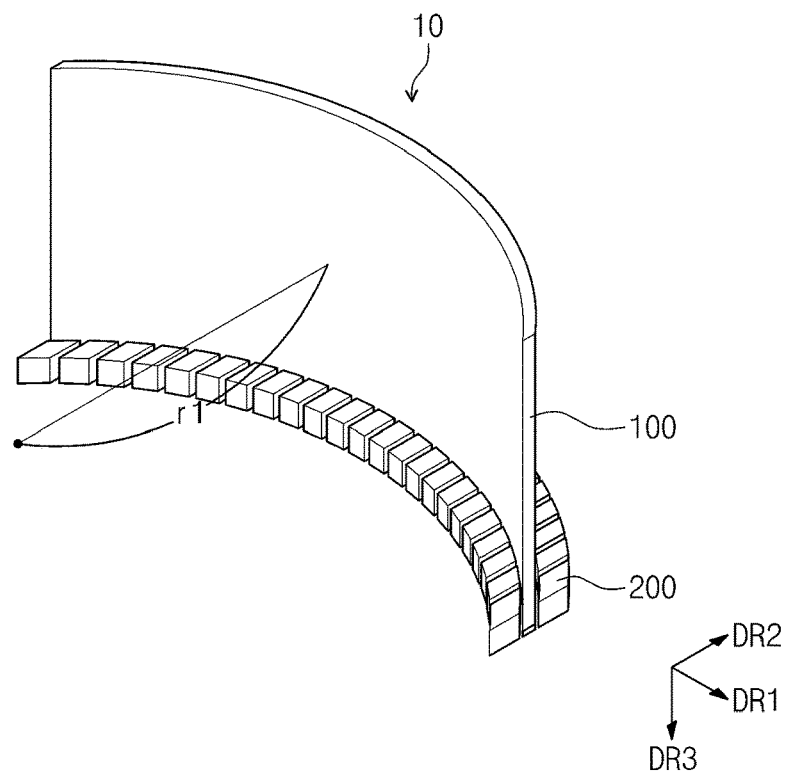
FIGS. 12A and 12B are perspective views showing a display device including a curved display module.
Figure 12B:
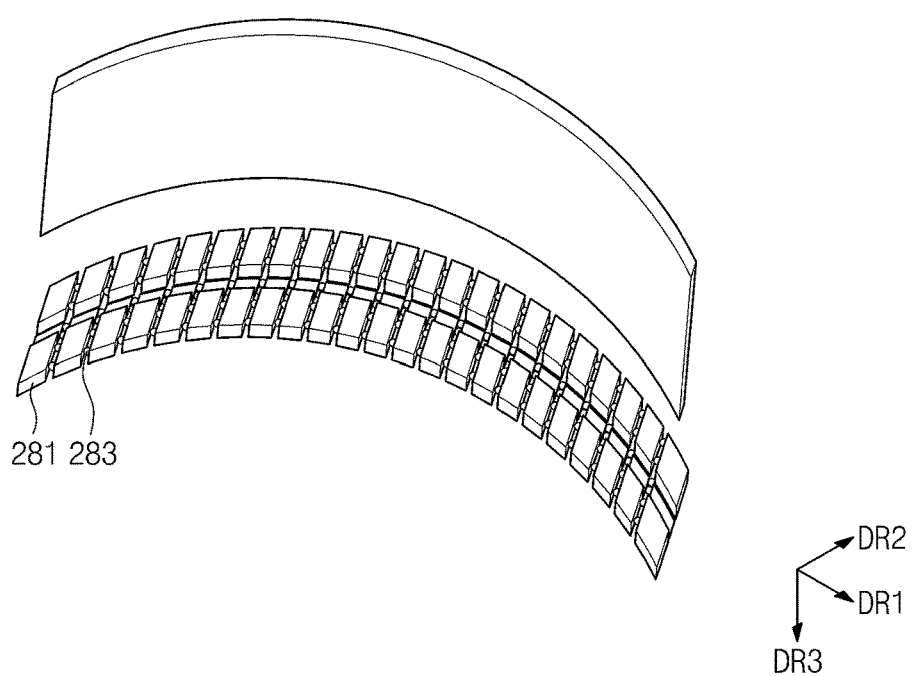
Figure 13A:
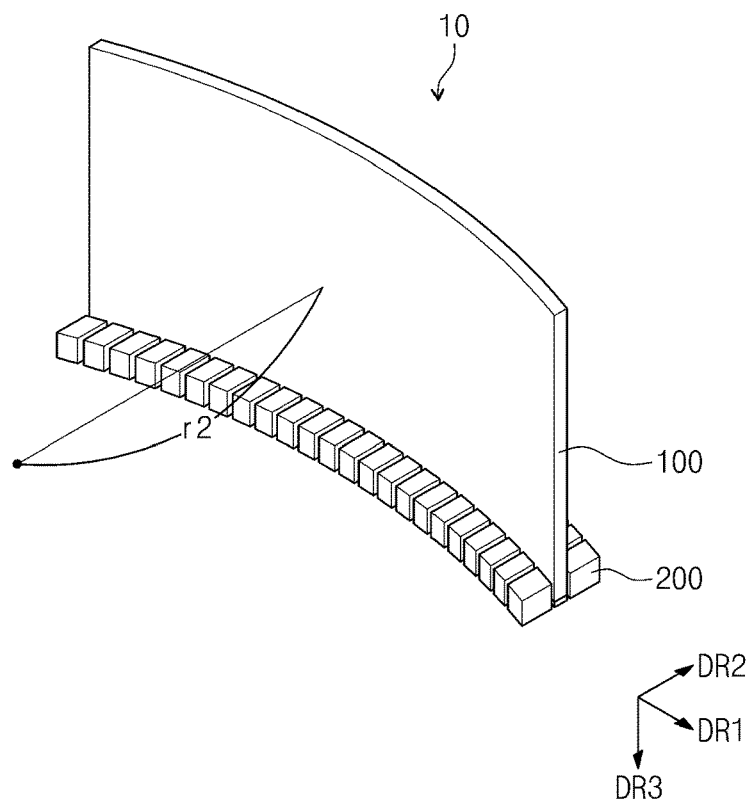
FIGS. 13A and 13B are perspective views showing a display device including a curved display module having a curvature radius smaller than that of the curved display module shown in FIGS. 12A and 12B.
Figure 13B:
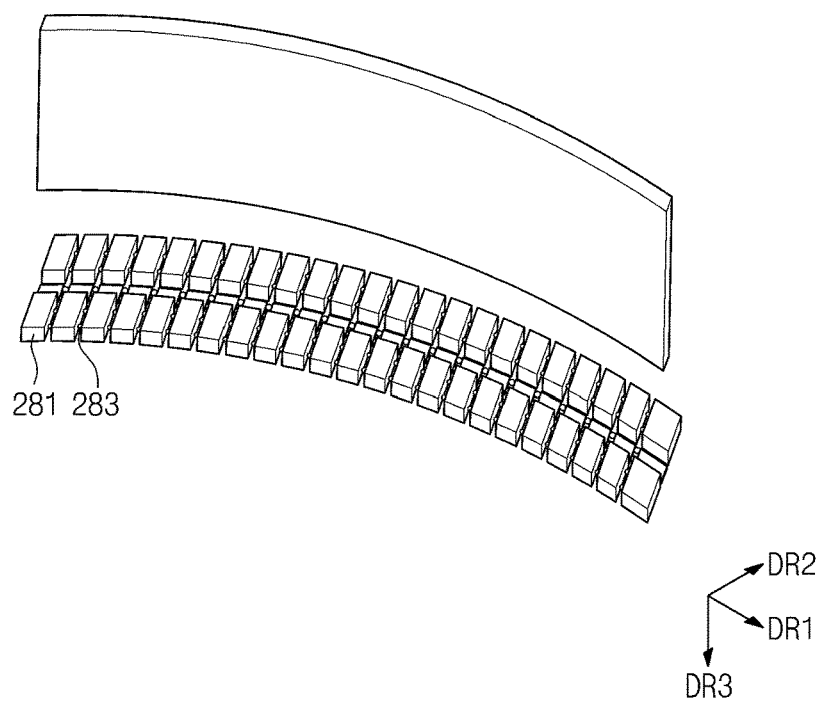

FIGS. 12A and 12B are perspective views showing a display device including a curved display module and FIGS. 13A and 13B are perspective views showing a display device including a curved display module having a curvature radius smaller than that of the curved display module shown in FIGS. 12A and 12B.

Referring to FIGS. 12A, 12B, 13A, and 13B, the stand 200 has a curvature radius that is variable corresponding to curvature radiuses r1 and r2 of the curved display module 100. According to the display device 10 of the invention, curved display modules having the curvature radiuses r1 and r2 different from each other may be fixed to one stand 200. In FIGS. 12A, 12B, 13A, and 13B, two curved display modules having different curvature radiuses are fixed to one stand 200, but they should not be limited thereto or thereby. That is, although one curved display module has a variable curvature radius, the one curved display module having the variable radius may be fixed to one stand.

The stand 200 includes a plurality of blocks 281 and a plurality of block connection parts 283. A curvature radius of the groove GR may be controlled using the blocks 281 and the block connection parts 283 to correspond to the curved display module 100. The curvature radius r1 of the curved display module form the point O1 shown in FIG. 12A may be smaller than the curvature radius r2 of the curved display module 100 form the point O2 shown in FIG. 13A. In an exemplary embodiment, the curvature radius of the groove GR of the stand 200, to which the curved display module 100 is fixed in consideration of the curvature radius r1 of the curved display module 100 shown in FIG. 12A, may be controlled to correspond to the curvature radius r2 of the curved display module 100 shown in FIG. 13A, for example. Therefore, the curved display module 100 shown in FIGS. 12A and 12B and the curved display module 100 shown in FIGS. 13A and 13B may be selectively fixed to the one stand 200 without using a separate stand.

In FIGS. 12A, 12B, 13A, and 13B, the curvature radius of the groove GR is controlled by the blocks 281 and the block connection parts 283, which are included in the stand 200, but it should not be limited thereto or thereby. That is, the stand 200 may have various other shapes as long as the curvature radius of the groove GR may be controlled to correspond to the curvature radius of the curved display module 100.

Figure 14A:
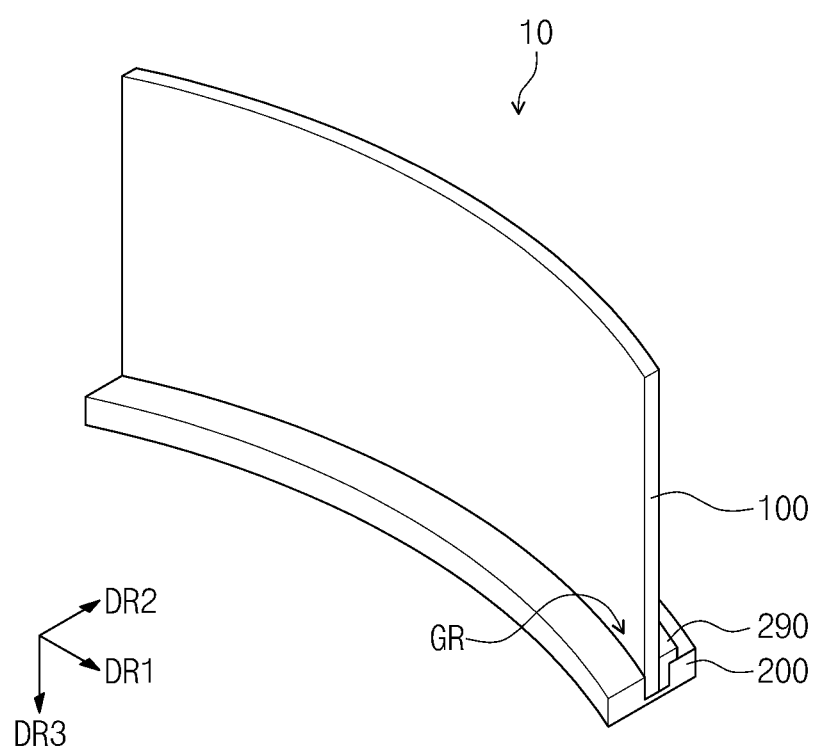
FIG. 14A is a perspective view showing an exemplary embodiment of a display device including an auxiliary stand according to the invention.
Figure 14B:
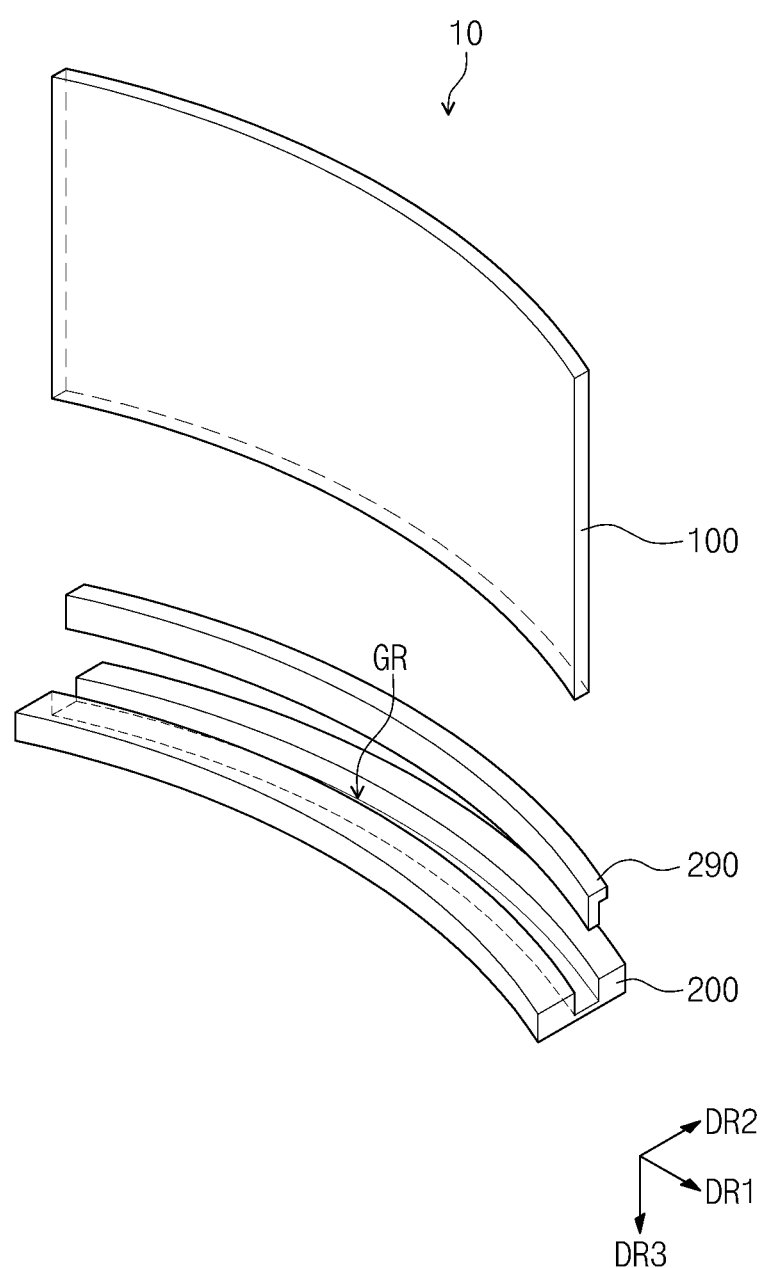
FIG. 14B is an exploded perspective view showing an exemplary embodiment of a display device including an auxiliary stand according to the invention.

FIG. 14A is a perspective view showing a display device 10 including an auxiliary stand according to an exemplary embodiment of the invention, and FIG. 14B is an exploded perspective view showing a display device including an auxiliary stand according to an exemplary embodiment of the invention.

Referring to FIGS. 14A and 14B, the display device 10 may further include an auxiliary supporter 290. The auxiliary supporter 290 assists to accommodate and fix the curved display module 100 into the stand 200. In an exemplary embodiment, a portion of the auxiliary supporter 290 is accommodated in the groove GR to prevent the curved display module 100 from being separated from the stand 200, for example. As show in FIG. 14A, the auxiliary supporter 290 has substantially an L-shape in a side view, but it should not be limited thereto or thereby. The auxiliary supporter 290 may have various other shapes as long as the auxiliary supporter 290 assists to fix the curved display module 100 to the stand 200. In addition, FIGS. 14A and 14B show one auxiliary supporter 290, but the auxiliary supporter 290 may be provided in a plural number according to other exemplary embodiments. The display device according to the illustrated exemplary embodiment includes the stand in which the lower portion of the curved display module is accommodated. Thus, the curved display module may be fixed to the stand without increasing the thickness of the curved display module. Accordingly, the display device according to the exemplary embodiment of the invention may be substantially slim.

In addition, according to the display device, the signal receiver is included in the curved display module and the signal transmitter is included in the stand. Therefore, although the signal receiver or the signal transmitter is out of order or defective, the defective signal receiver or the defective signal transmitter may be repaired or replaced with another signal receiver or another signal transmitter after the curved display module is separated from the stand. That is, in the case where defects occur in a conventional display device, the display device is required to be replaced. However, according to the display device of the invention, any one of the curved display device and the stand, in which defects occur, is required to be replaced.

Although the exemplary embodiments of the invention have been described, it is understood that the invention should not be limited to these exemplary embodiments but various changes and modifications can be made by one ordinary skilled in the art within the spirit and scope of the invention as hereinafter claimed.

What is claimed is:

1. A display device comprising:
   a curved display module comprising a signal receiver which receives an image signal from an outside source, an image display part comprising an exit surface and rear surface, the image display part which displays an image corresponding to the image signal on the exit surface, and
   a stand comprising a signal transmitter which transmits the image signal and a coupling part in which a curved groove is defined,
   wherein the curved display module is rigid,
   wherein the curved display module has a concave shape when a user is facing the exit surface and when viewed in an exit rear surface direction from the exit surface to the rear surface,
   wherein a curved portion of the curved display module is accommodated in the curved groove, the curved groove is curved along a direction which the curved portion of the curved display module is extended in,
   wherein the curved groove has a varying curvature radius which corresponds to a curvature radius of the curved display module,
   wherein the stand changes the curvature radius of the curved groove by changing a shape thereof.

2. The display device of claim 1, further comprising a frame surrounding at least a portion of an edge of the image display part, and
   wherein at least a portion of the frame is accommodated in the curved groove, and
   wherein the frame electrically connect the image display part and the stand.

3. The display device of claim 2, wherein the curved display module comprises:

an exit rear surface facing the exit surface;
a lower surface connected to the exit surface and the exit rear surface;
an upper surface facing the lower surface;
a first side surface connected to the upper surface and the lower surface; and
a second side surface facing the first side surface, and at least a portion of the lower surface is accommodated in the curved groove.

4. The display device of claim 3, wherein the signal receiver is disposed on the lower surface.

5. The display device of claim 3, wherein the exit surface comprises:
a display area which displays the image; and
a non-display area which does not display the image, and of which at least a portion is accommodated in the curved groove.

6. The display device of claim 5, wherein the non-display area comprises:
a first sub-non-display area of which at least a portion thereof is accommodated in the curved groove; and
a second sub-non-display area spaced apart from the first sub-non-display area, and a length in a vertical direction of the first sub-non-display area is greater than a length in the vertical direction of the second sub-non-display area.

7. The display device of claim 1, wherein the coupling part comprises:
a bottom portion;
a first sidewall portion connected to the bottom portion; and
a second sidewall portion contacting the bottom portion and spaced apart from the first sidewall portion, and the curved groove is defined by an upper surface of the bottom portion, an inner surface of the first sidewall portion, and an inner surface of the second sidewall portion.

8. The display device of claim 7, wherein the signal transmitter is disposed on the upper surface of the bottom portion.

9. The display device of claim 7, wherein each of the first sidewall portion and the second sidewall portion is curved.

10. The display device of claim 7, wherein a distance between the first sidewall portion and the second sidewall portion is constant.

11. The display device of claim 7, wherein each of the inner surface of the first sidewall portion and the inner surface of the second sidewall portion is curved.

12. The display device of claim 7, wherein the coupling part further comprises:
a first connection portion connecting the first sidewall portion and the second sidewall portion; and
a second connection portion connecting the first sidewall portion and the second sidewall portion and facing the first connection portion, and the curved groove is defined by the upper surface of the bottom portion, the inner surface of the first sidewall portion, the inner surface of the second sidewall portion, an inner surface of the first connection portion, and an inner surface of the second connection portion.

13. The display device of claim 7, wherein the curved groove has a curvature radius which is variable corresponding to a curvature radius of the curved display module.

14. The display device of claim 1, wherein a length in a horizontal direction of the stand is equal to or greater than about 2/3 and equal to or smaller than about 5/3 of a length in the horizontal direction of the curved display module.

15. The display device of claim 1, further comprising a frame surrounding an edge of the image display part, and
wherein the frame is rigid and the frame has a curved shape,
wherein the image display part is flexible,
the edge of the image display part is changed to be curved along the shape of the frame,
wherein at least a portion of the frame is accommodated in the curved groove, and
wherein the frame electrically connect the image display part and the stand.

16. A display device comprising:
a curved display module which receives an image signal from an outside source, displays an image corresponding to the image signal, and is curved; and
a stand in which a curved groove is defined and which transmits the image signal, wherein a portion of the curved display module is accommodated in the curved groove, and
wherein the curved groove has a varying curvature radius which corresponds to a curvature radius of the curved display module,
wherein the stand changes the curvature radius of the curved groove by changing a shape thereof,
wherein the stand comprises a plurality of blocks and a plurality of connection parts, and the plurality of blocks and connection parts are movable to change the curvature radius of the curved groove,
wherein the curved display module comprises:
an image display part which displays the image;
a frame surrounding at least a portion of an edge of the image display part; and
a signal receiver which receives the image signal, and the stand comprises:
a coupling part in which the curved groove is defined; and
a signal transmitter which transmits the image signal, and
wherein the signal receiver is disposed on a lower surface of the frame.

17. The display device of claim 16, wherein the coupling part comprises:
a bottom portion;
a first sidewall portion connected to the bottom portion; and
a second sidewall portion contacting the bottom portion and spaced apart from the first sidewall portion, and the curved groove is defined by an upper surface of the bottom portion, an inner surface of the first sidewall portion, and an inner surface of the second sidewall portion.

18. The display device of claim 17, wherein the signal transmitter is disposed on the upper surface of the bottom portion.

19. A display device comprising:
a curved display module comprising:
a signal receiver which receives an image signal from an outside source;
an image display part which displays an image corresponding to the image signal and being curved; and
a frame surrounding at least a portion of an edge of the image display part; and
a stand comprising:
a signal transmitter which transmits the image signal; and
a coupling part in which a curved groove is defined, the coupling part comprising:
a bottom portion;
a first sidewall portion connected to the bottom portion; and a second sidewall portion contacting the bottom portion and spaced apart from the first sidewall portion, the curved groove defined by an upper surface of the bottom portion, an inner surface of the first sidewall portion, and an inner surface of the second sidewall portion, wherein a portion of the curved display module is accommodated in the curved groove, the signal receiver is disposed on a lower surface of the frame, and the signal transmitter is disposed on the upper surface of the bottom portion, wherein the curved groove has a varying curvature radius which corresponds to a curvature radius of the curved display module, and wherein the stand changes the curvature radius of the curved groove by changing a shape thereof.

* * * * *